(12) United States Patent
Chang et al.

(10) Patent No.: US 10,332,572 B2
(45) Date of Patent: Jun. 25, 2019

(54) MEMORY DEVICE AND MANUFACTURING METHOD THEREOF

(71) Applicant: Winbond Electronics Corp., Taichung (TW)

(72) Inventors: Wei-Che Chang, Taichung (TW); Yoshinori Tanaka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/005,698

(22) Filed: Jun. 12, 2018

(65) Prior Publication Data

US 2019/0019542 A1    Jan. 17, 2019

(30) Foreign Application Priority Data

Jul. 14, 2017    (CN) .......................... 2017 1 0573944

(51) Int. Cl.
| | |
|---|---|
| *G11C 7/18* | (2006.01) |
| *H01L 27/105* | (2006.01) |
| *H01L 21/027* | (2006.01) |
| *H01L 21/762* | (2006.01) |
| *G11C 5/02* | (2006.01) |
| *G11C 8/14* | (2006.01) |

(52) U.S. Cl.
CPC .................. *G11C 7/18* (2013.01); *G11C 5/02* (2013.01); *G11C 8/14* (2013.01); *H01L 21/027* (2013.01); *H01L 21/76224* (2013.01); *H01L 27/1052* (2013.01)

(58) Field of Classification Search
CPC .... G11C 7/18; G11C 5/02; G11C 8/14; H01L 21/027; H01L 21/76224; H01L 27/1052
USPC ...................................................... 365/51, 63
See application file for complete search history.

(56) References Cited

U.S. PATENT DOCUMENTS

| | | | |
|---|---|---|---|
| 2012/0112258 A1* | 5/2012 | Mine ................. | H01L 21/76224 257/296 |
| 2014/0038387 A1* | 2/2014 | Kishida .................. | H01L 29/06 438/435 |
| 2016/0043143 A1 | 2/2016 | Sakotsubo | |
| 2018/0175040 A1* | 6/2018 | Kim .................. | H01L 27/10814 |

\* cited by examiner

*Primary Examiner* — Tan T. Nguyen
(74) *Attorney, Agent, or Firm* — JCIPRNET

(57) ABSTRACT

Provided is a memory device including a substrate, isolation structures, conductive pillars, and bit-line structures. The substrate includes active areas. The active areas are arranged as a first array. The isolation structures are located in the substrate and extending along a Y direction. Each of the isolation structures is arranged between the active areas in adjacent two columns. The conductive pillars are located on the substrate and arranged as a second array. The conductive pillars in adjacent two rows are in contact with the active areas arranged as the same column, to form a first contact region and a second contact region. The bit-line structures are arranged on the substrate in parallel along a X direction. Each of the bit-line structures is in contact with the active areas arranged as the same column, to form a third contact region between the first and second regions.

16 Claims, 34 Drawing Sheets

A-A'

B-B'

C-C'

D-D'

A-A'

B-B'

C-C'

D-D'

A-A'

B-B'

C-C'

D-D'

A-A'

B-B'

C-C'

D-D'

A-A'

B-B'

C-C'

D-D'

A-A'

B-B'

C-C'

D-D'

A-A'

B-B'

C-C'

D-D'

A-A'

B-B'

C-C'

D-D'

A-A'

B-B'

C-C'

D-D'

A-A'

B-B'

C-C'

D-D'

E-E'

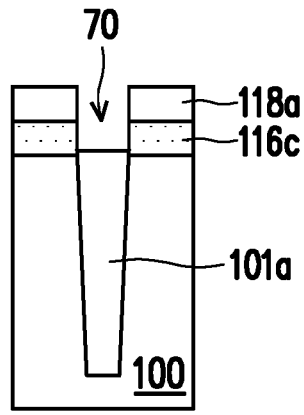
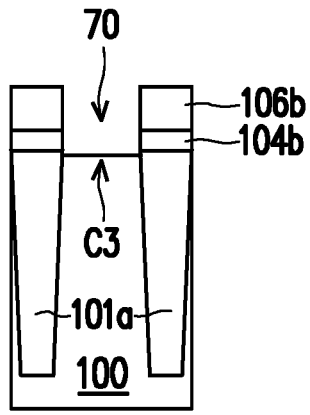
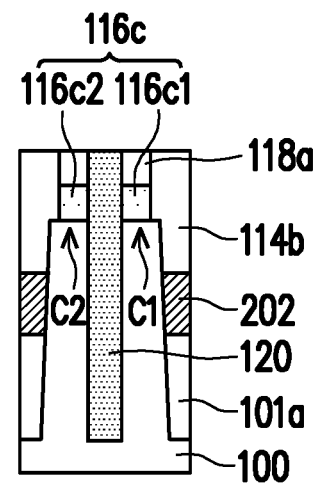
FIG. 2O     FIG. 3O     FIG. 4O
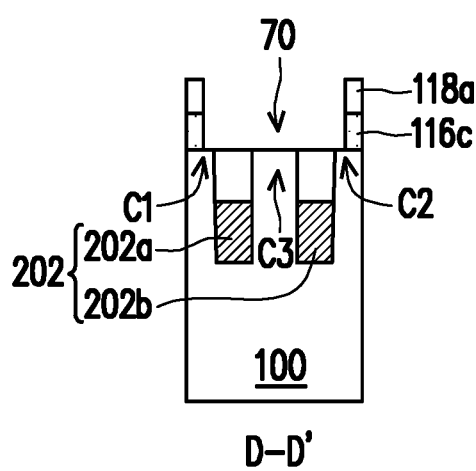
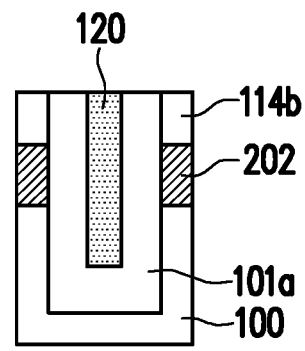
FIG. 5O     FIG. 6D

MEMORY DEVICE AND MANUFACTURING METHOD THEREOF

CROSS-REFERENCE TO RELATED APPLICATION

This application claims the priority benefit of China application serial no. 201710573944.1, filed on Jul. 14, 2017. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and more particularly, to a memory device and a manufacturing method thereof.

Description of Related Art

As the density of the memory is increased, the word line spacing and the isolation structures of the memory array become smaller, such that memory manufacture becomes more difficult, in prior art, a plurality of lithography processes is often adopted to respectively form isolation structures, buried word lines, bit lines, and capacitor contacts. The various process steps above readily produce alignment issues. The alignment issues become more significant as device size is reduced. Therefore, how to develop a manufacturing method of a memory device that can alleviate the issue of reduced contact area between active areas and the capacitor contacts caused by an offset in the lithography process is an important topic.

SUMMARY OF THE INVENTION

The invention provides a manufacturing method of a memory device including the following steps. A plurality of first isolation structures is formed in a substrate. The first isolation structures separate the substrate into a plurality of strip patterns. The strip patterns are extended along the X direction and alternately arranged along the Y direction. A plurality of word line sets is formed in the substrate. The word line sets are extended along the Y direction and pass through the first isolation structures and the strip patterns to divide the substrate into a plurality of first regions and a plurality of second regions. The first regions and the second regions are alternately arranged along the X direction and the word line sets are located in the first regions. A first dielectric pattern is formed on the substrate. The first dielectric pattern covers the word line sets and exposes the surface of the substrate of the second regions. A conductive layer is formed on the substrate of the second regions. The top surface of the conductive layer is lower than the top surface of the first dielectric pattern. A plurality of second isolation structures is formed in the conductive layer and the substrate of the second regions. The second isolation structures are extended along the Y direction and separate the strip patterns into a plurality of active areas. The active areas are disposed as ribbons and arranged in a first array. A plurality of bit line structures is foil red on the substrate. The bit line structures are extended along the X direction and disposed across the word line sets.

The invention provides a memory device including a substrate, a plurality of isolation structures, a plurality of conductive columns, a plurality of bit line structures, and a plurality of spacers. The substrate includes a plurality of active areas. The active areas are disposed as ribbons and arranged in a first array. The isolation structures are located in the substrate and extended along the Y direction. Each of the isolation structures is disposed between two adjacent columns of active areas. The conductive columns are located on the substrate and arranged in a second array. Two adjacent rows of conductive columns are in contact with active areas arranged in the same column to form a first contact region and a second contact region. The plurality of bit line structures is disposed on the substrate in a parallel manner along the X direction. Each of the bit line structures is in contact with active areas arranged in the same column to form a third contact region between the first contact region and the second contact region. The spacers are disposed on the sidewall of the bit line structures in a parallel manner along the X direction to electrically isolate the bit line structures and the conductive columns.

Based on the above, in the invention, isolation structures can be formed by forming self-aligned trenches to alleviate the issue of reduced contact area between the active areas and the capacitor contacts caused by an offset in the lithography process. Moreover, in the invention, silicon nitride is used as the material of the self-aligned isolation structures to reduce the loss of the silicon substrate and prevent the issue of reduced contact area between the active areas and the capacitor contacts. Moreover, the invention can reduce the alignment steps in the process to reduce the number of photomasks and therefore lower production cost.

In order to make the aforementioned features and advantages of the disclosure more comprehensible, embodiments accompanied with figures are described in detail below.

BRIEF DESCRIPTION OF THE DRAWINGS

FIG. 6A to FIG. 6E are cross sections along segment E-E' of FIG. 1L to FIG. 1P.

DESCRIPTION OF THE EMBODIMENTS

Figure 1A:
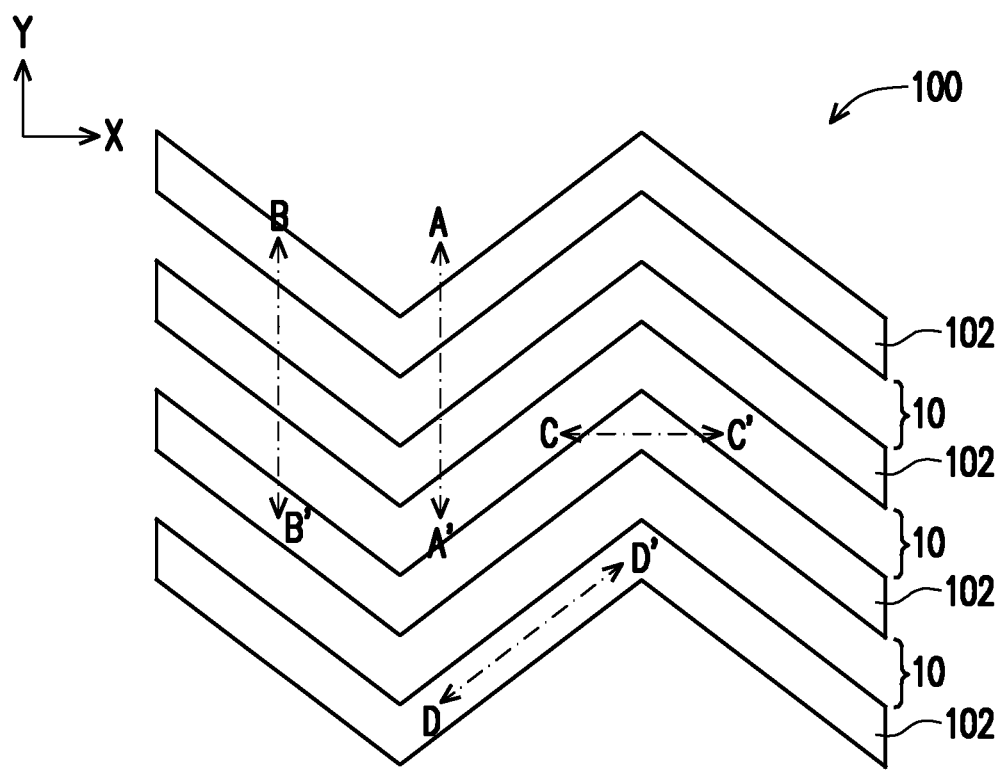
FIG. 1A to FIG. 1P are top views of a manufacturing process of a memory device of the first embodiment of the invention.

The invention is more comprehensively described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Referring to all of FIG. 1A to FIG. 5A, the present embodiment provides a manufacturing method of a memory device including the following steps. First, a substrate 100 is provided. In the present embodiment, the substrate 100 can be, for instance, a semiconductor substrate, a semiconductor compound substrate, or a semiconductor-over-insulator (SOI) substrate.

Figure 1B:
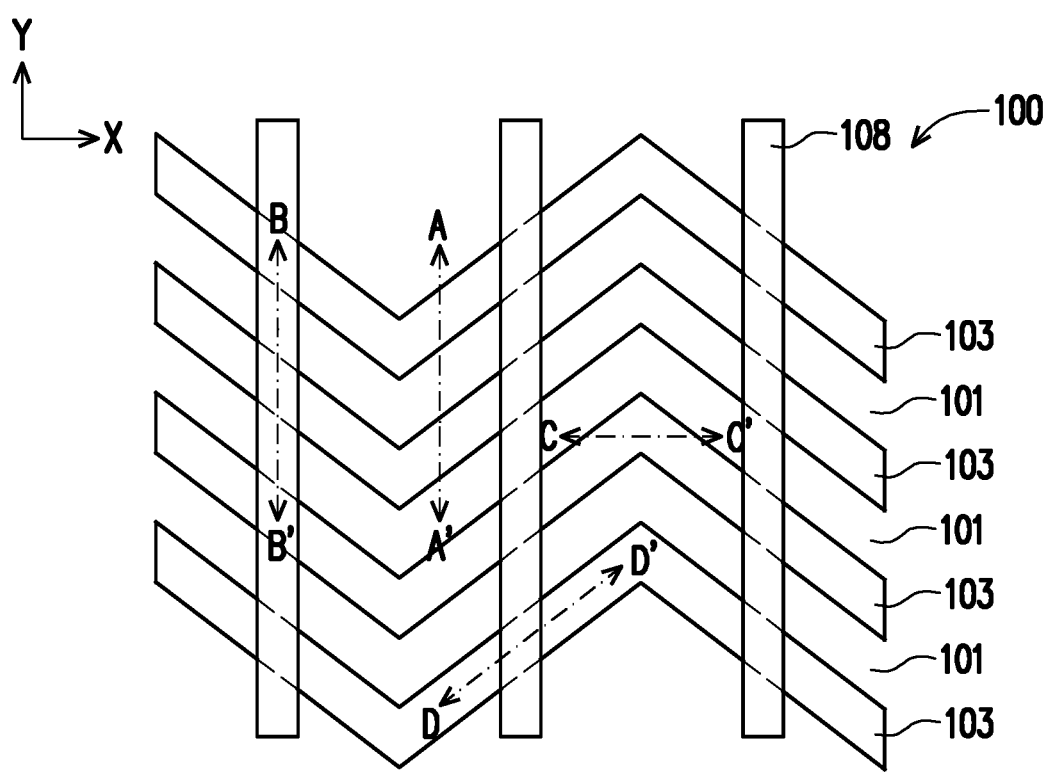
FIG. 1Q is a top view of a memory device of the second embodiment of the invention.
Figure 1C:
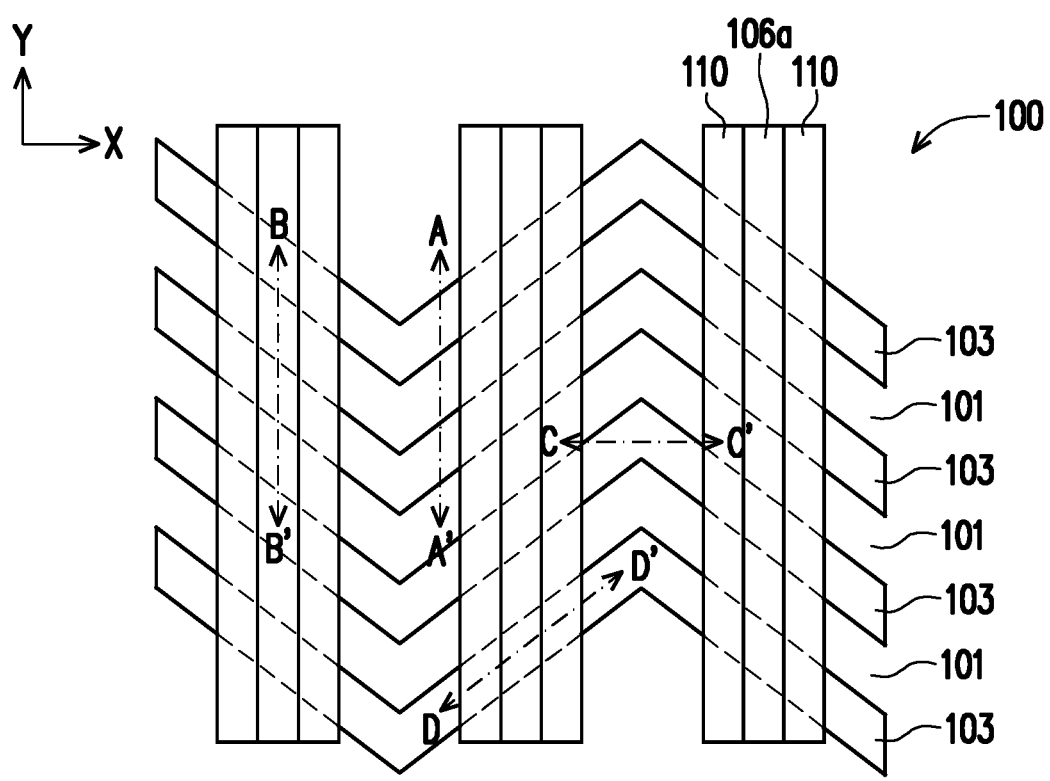
Figure 1D:
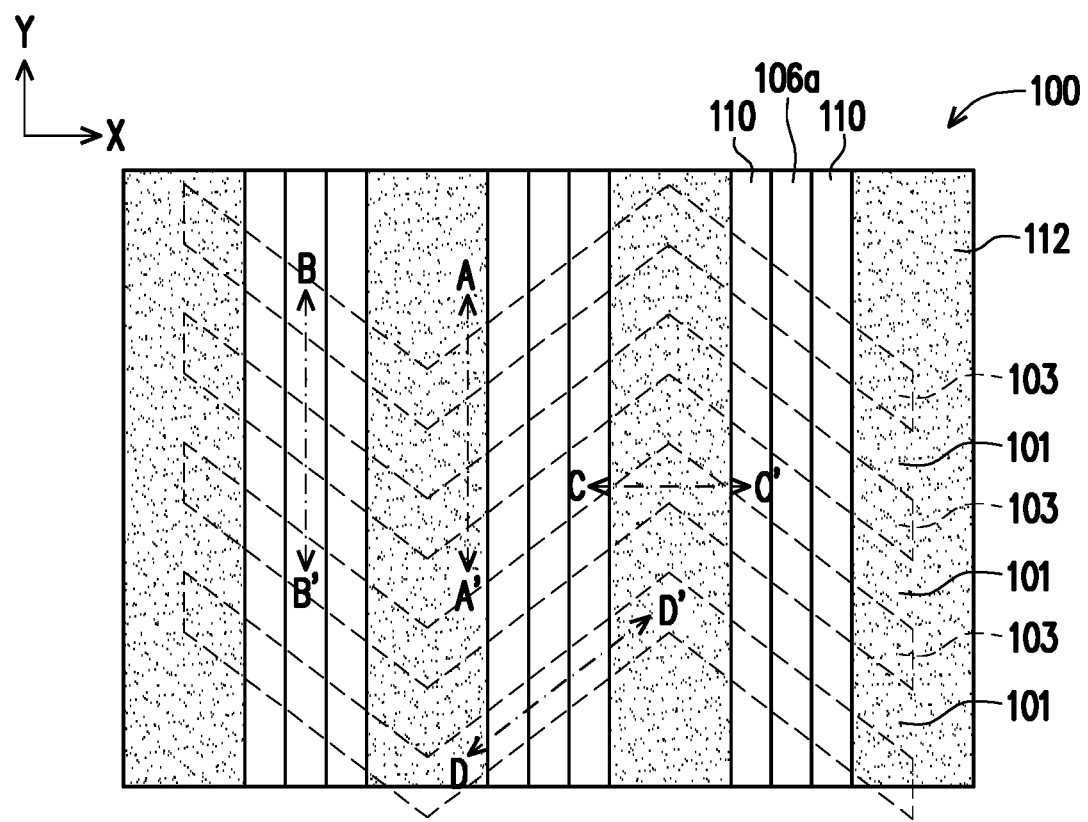
Figure 1E:
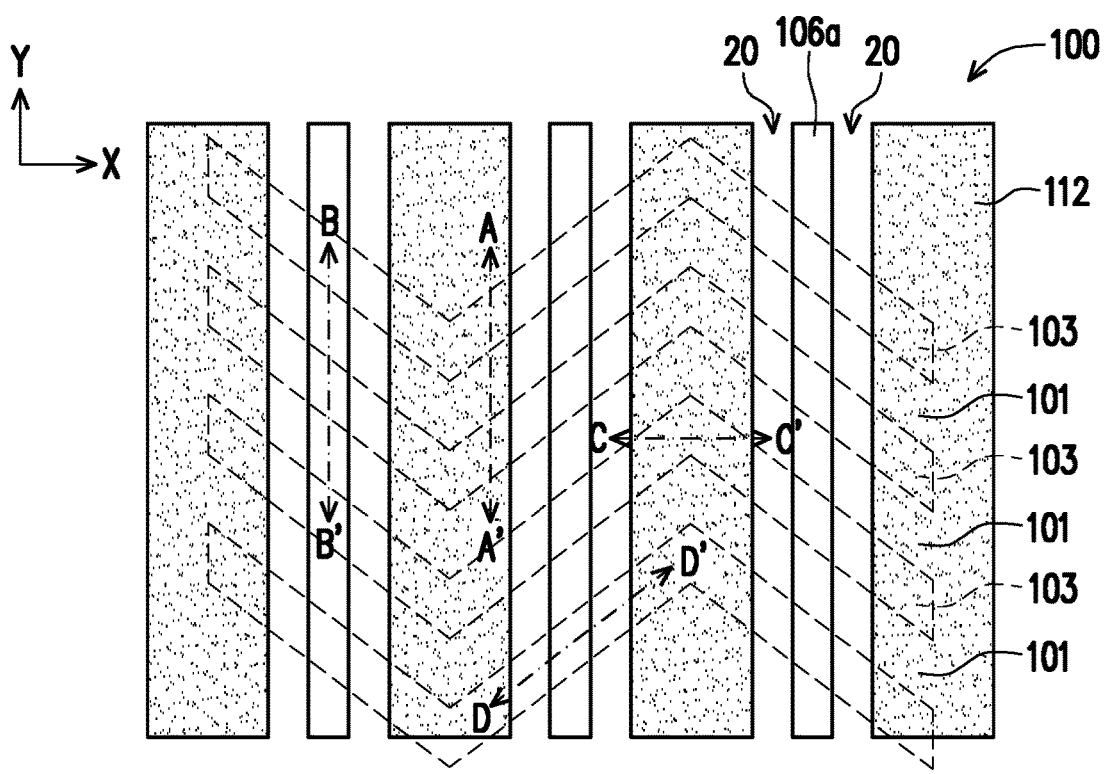
Figure 1F:
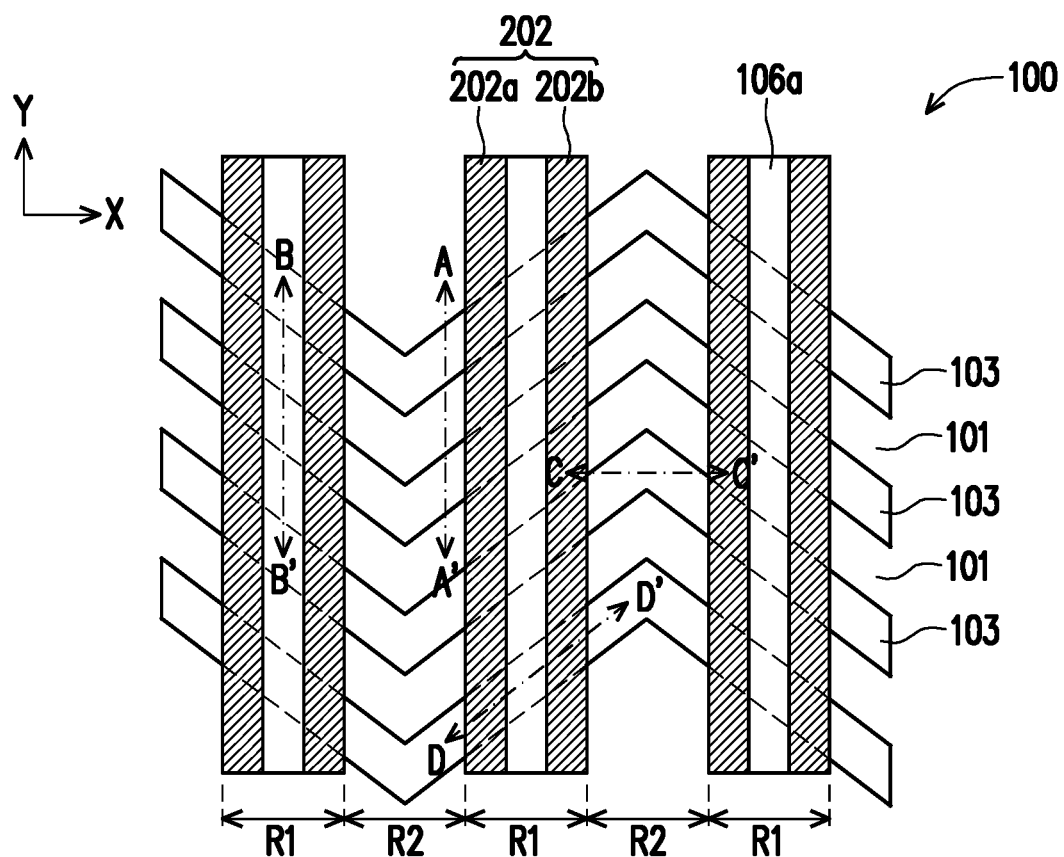
Figure 1G:
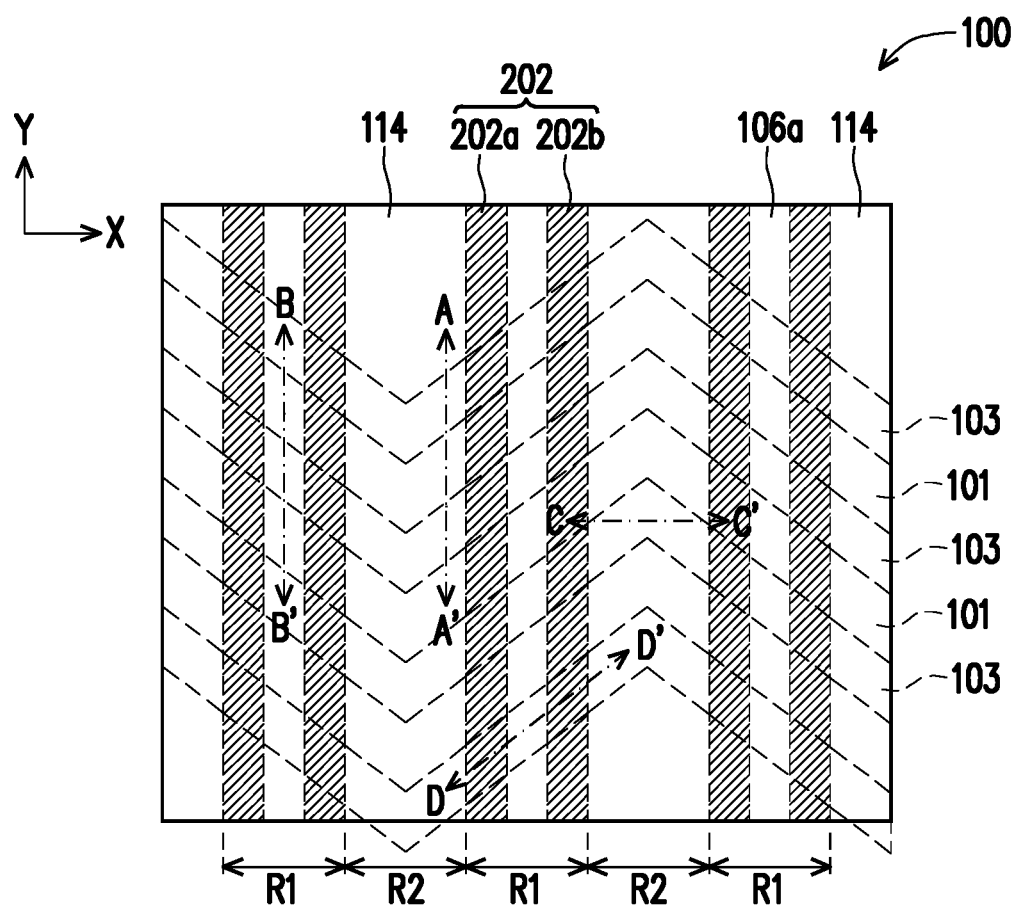
Figure 1H:
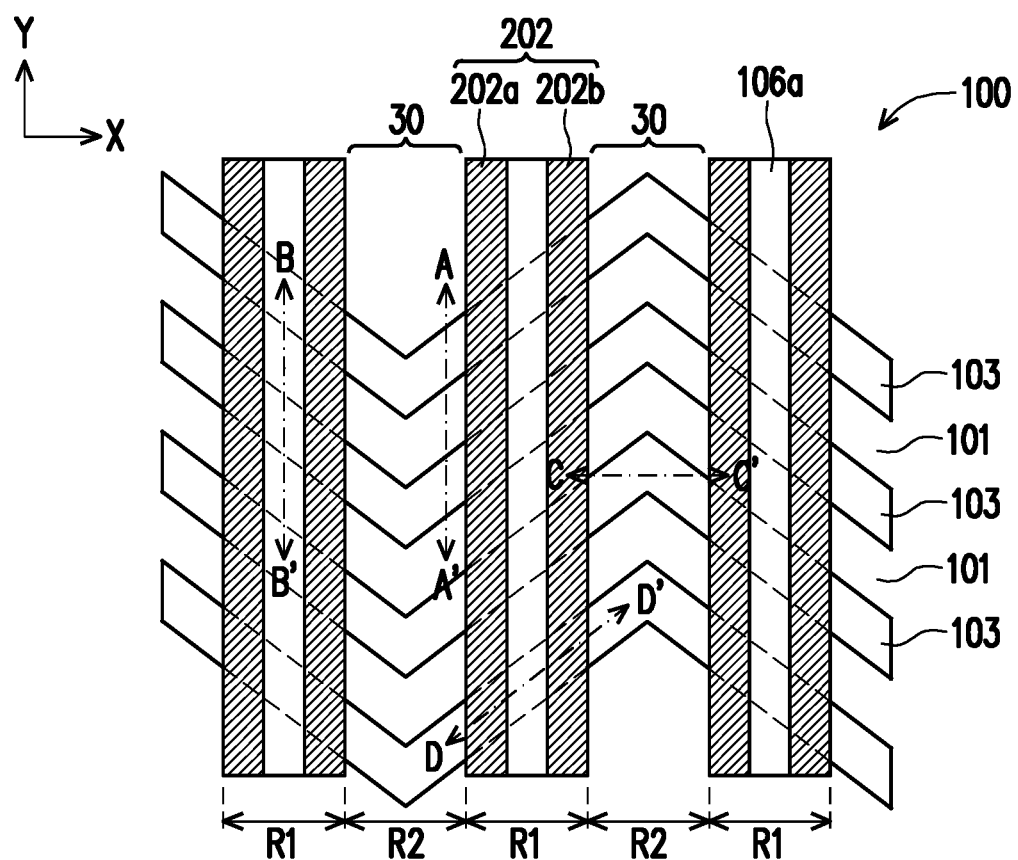
Figure 1I:
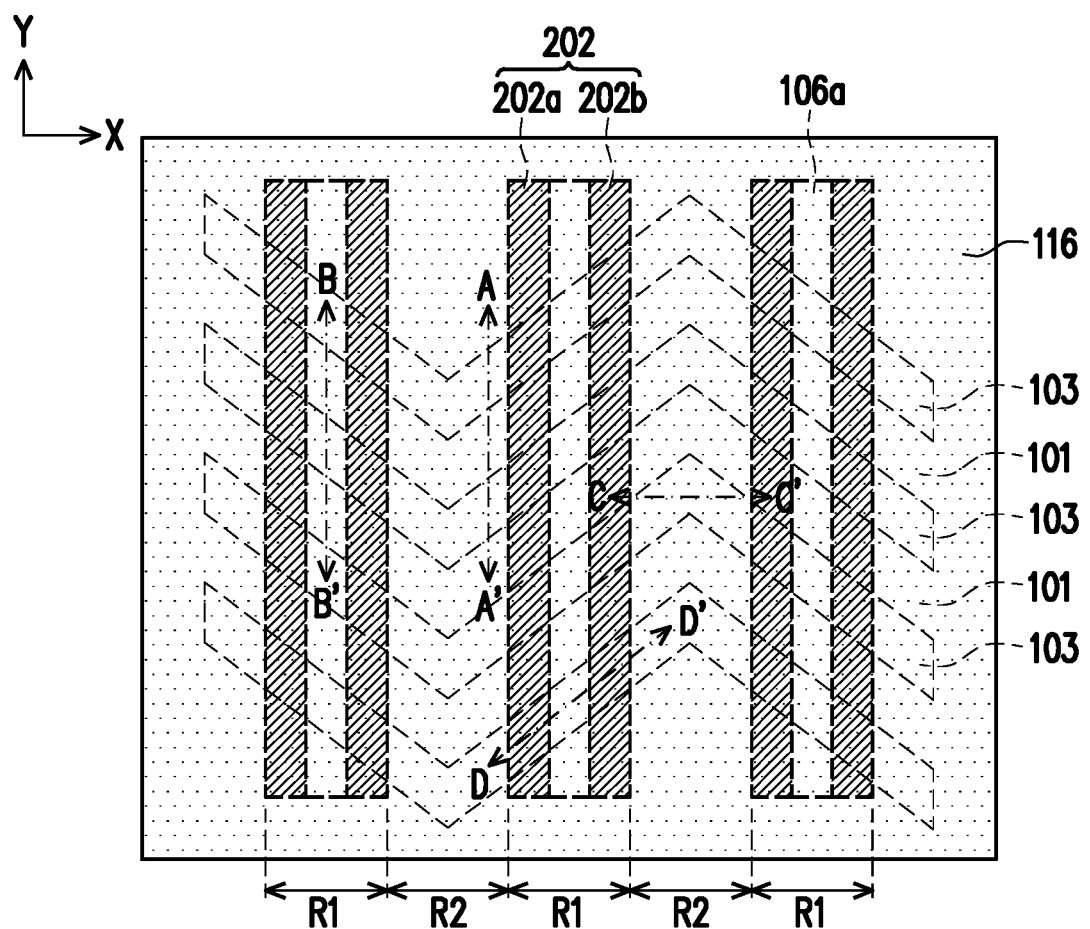
Figure 1J:
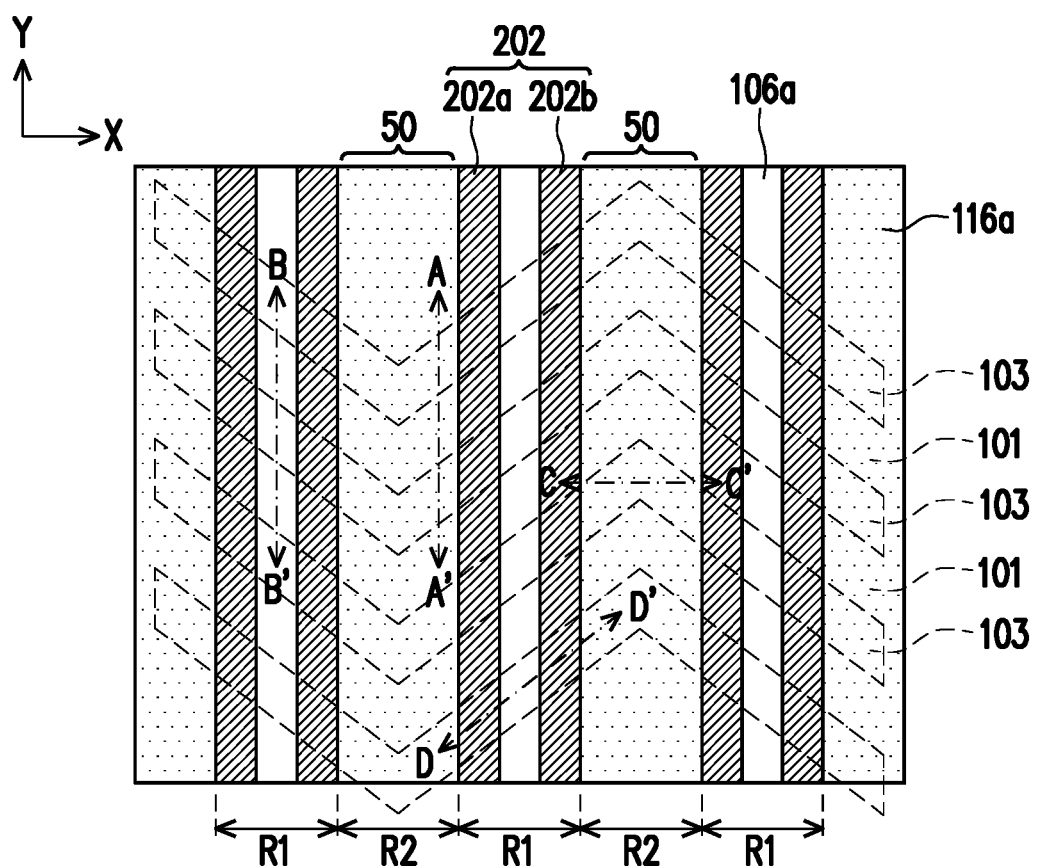
Figure 1K:
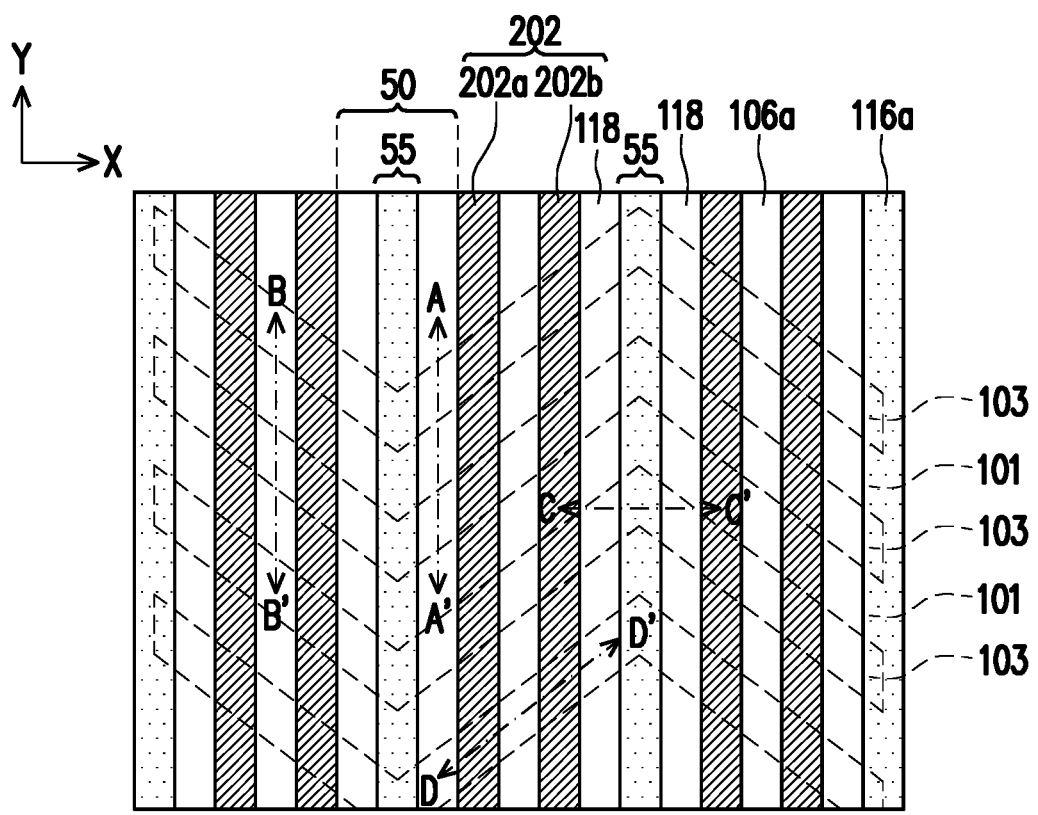
Figure 1L:
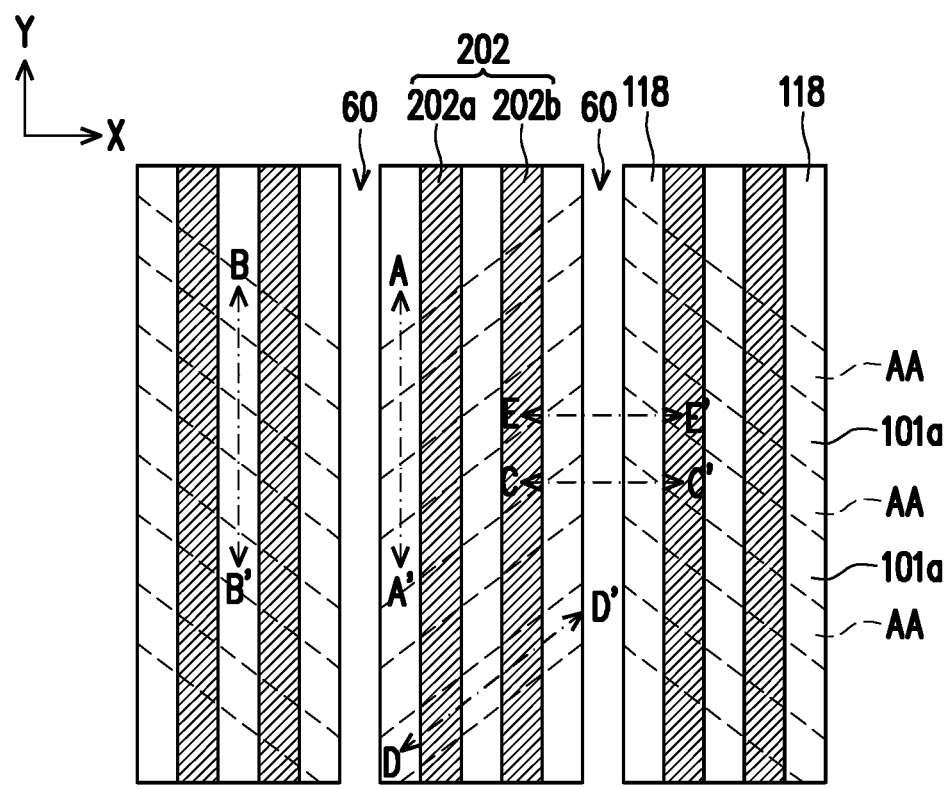

Next, a hard mask layer 102 is formed on the substrate 100 to define subsequently-formed active areas AA (as shown in FIG. 1L). Next, a portion of the substrate 100 is removed by using the hard mask layer 102 as a mask to form a plurality of trenches 10 in the substrate 100. As shown in FIG. 1A, the trenches 10 are extended along the X direction and alternately arranged along the Y direction. Although the trenches 10 shown in FIG. 1A are bent, the invention is not limited thereto. In other embodiments, the trenches 10 can also be straight strip trenches parallel to the X direction of intersected with the X direction at an angle. In an embodiment, the material of the hard mask layer 102 can be silicon nitride.

Referring to all of FIG. 1A to FIG. 5A and FIG. 1B to FIG. 5B, a dielectric material is filled in the trenches 10 to form first isolation structures 101 in the substrate 100. At this point, the first isolation structures 101 separate the substrate 100 into a plurality of strip patterns 103. The first isolation structures 101 and the strip patterns 103 are extended along the X direction and alternately arranged along the Y direction. In an embodiment, the dielectric material can be silicon oxide. The first isolation structures 101 can be, for instance, shallow-trench isolation (STI) structures.

Next, the hard mask layer 102 is removed, and a silicon oxide layer 104 and a silicon nitride layer 106 are formed on the substrate 100 in order. Next, a mask pattern 108 is formed on the silicon nitride layer 106. As shown in FIG. 1B, the mask pattern 108 is a straight strip pattern extended along the Y direction and alternately arranged along the X direction. The mask pattern 108 can be regarded as the spacing between subsequently-formed buried word lines 202a and 202b (as shown in FIG. 1F). In an embodiment, the material of the mask layer 108 can be a photoresist.

Figure 4A:
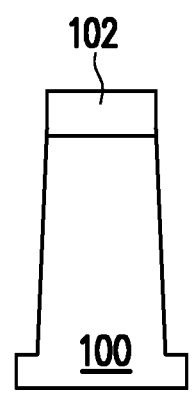
FIG. 4A to FIG. 4P are cross sections along segment C-C' of FIG. 1A to FIG. 1P.
Figure 5A:
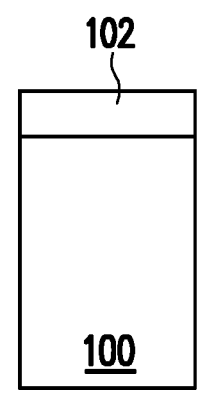
FIG. 5A to FIG. 5P are cross sections along segment D-D' of FIG. 1A to FIG. 1P.
Figure 2B:
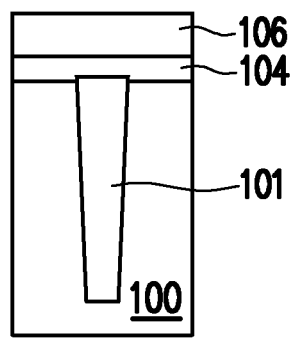
FIG. 2Q is a cross section along segment A-A' of FIG. 1Q.
Figure 3B:
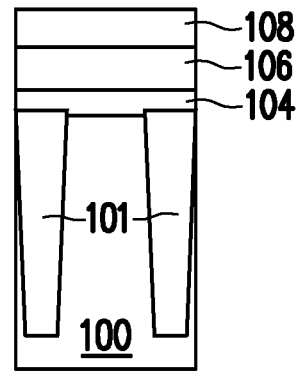
FIG. 3Q is a cross section along segment B-B' of FIG. 1Q.
Figure 4B:
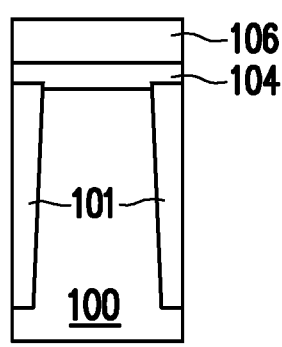
FIG. 4Q is a cross section along segment C-C' of FIG. 1Q.
Figure 5B:
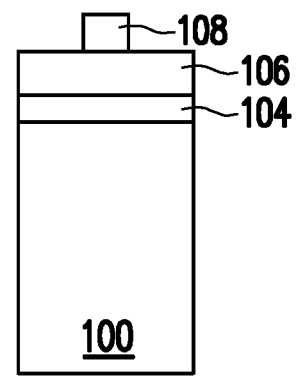
FIG. 5Q is a cross section along segment D-D' of FIG. 1Q.
Figure 2C:
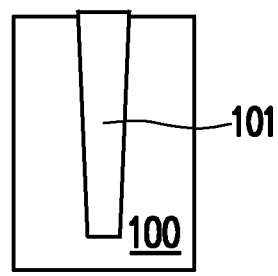
Figure 3C:
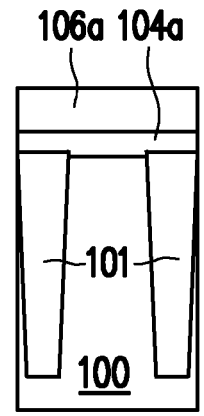
Figure 4C:
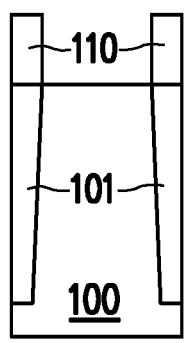
Figure 5C:
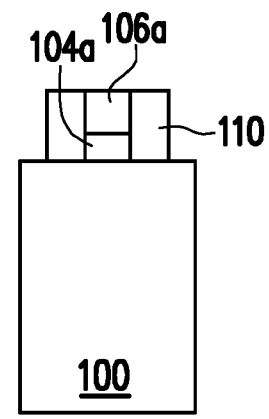
Figure 2D:
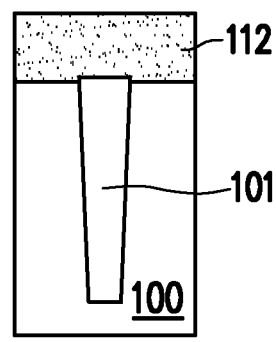
Figure 3D:
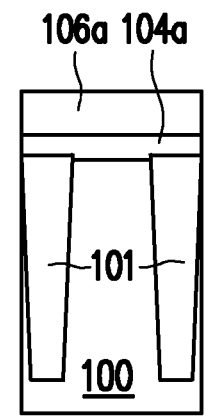
Figure 4D:
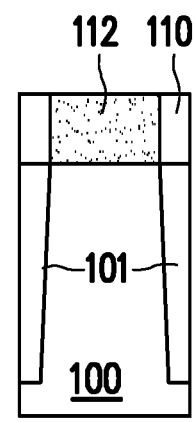
Figure 5D:
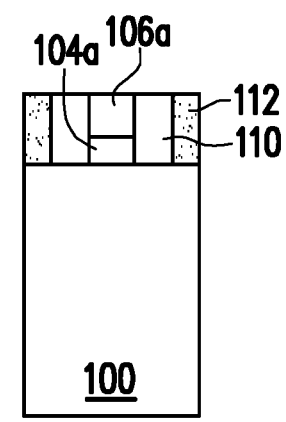
Figure 2E:
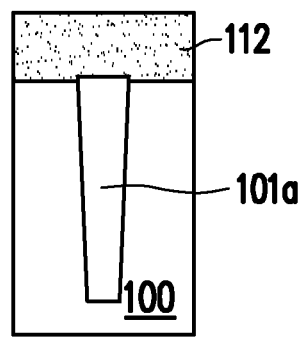
Figure 3E:
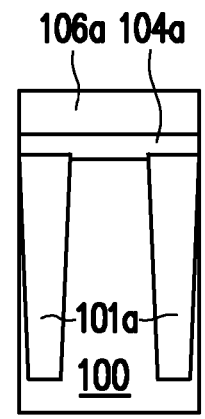
Figure 4E:
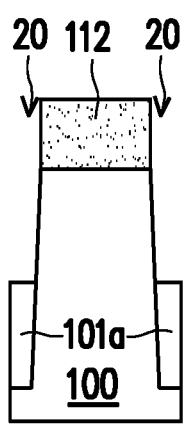
Figure 5E:
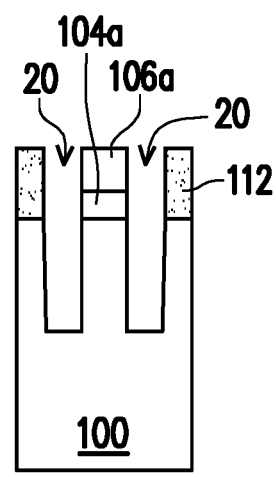
Figure 2F:
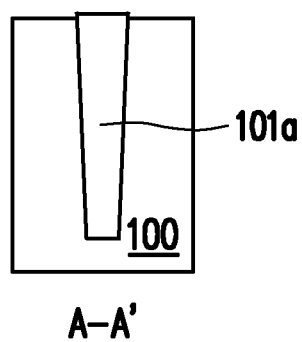
Figure 3F:
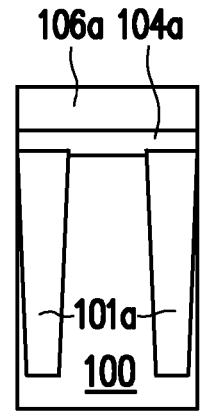
Figure 4F:
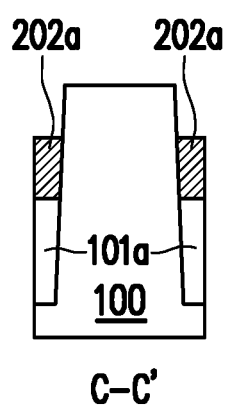

Referring to all of FIG. 1B to FIG. 5B and FIG. 1C to FIG. 5C, a portion of the silicon oxide layer 104 and the silicon nitride layer 106 is removed by using the mask pattern 108 as a mask to expose the top surface of the substrate 100. Next, the mask pattern 108 is removed. Next, a silicon oxide layer 110 is formed at two sides of a remaining silicon oxide layer 104a and a silicon nitride layer 106a. As shown in FIG. 1C and FIG. 5C, the silicon oxide layer 110 can be, for instance, formed on the sidewalls of the silicon oxide layer 104a and the silicon nitride layer 106a in the form of spacers. The forming method of the silicon oxide layer 110 is similar to the forming method of a known spacer and is therefore not repeated herein.

Referring to all of FIG. 1C to FIG. 5C and FIG. 1D to FIG. 5D, a photoresist layer 112 is formed between the silicon oxide layers 110 such that the photoresist layer 112 is also extended along the Y direction and alternately arranged with the dielectric structures (including the silicon nitride layer 106a and the silicon oxide layers 110 at two sides thereof) along the X direction. The forming method of the photoresist layer 112 can include coating first and then performing dry etching such that the top surface of the photoresist layer 112 is at the same height as the top surface of the silicon nitride layer 106a or slightly lower. As shown in FIG. 1D, each of the photoresist layers 112 is disposed across the turning point of the bent first isolation structures 101 (or the strip patterns 103).

Referring to all of FIG. 1D to FIG. 5D and FIG. 1E to FIG. 5E, the silicon oxide layer 110 and a portion of the substrate 100 and a portion of the first isolation structures 101 below are removed by using the silicon nitride layer 106a and the photoresist layer 112 as a mask to form trenches 20 in the substrate 100. As shown in FIG. 1E, the trenches 20 are extended along the Y direction.

Figure 5F:
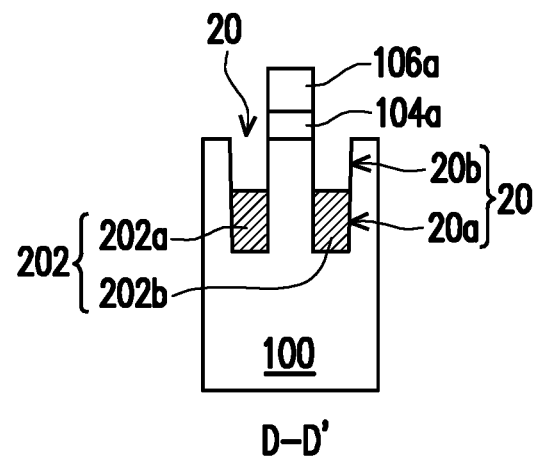
Figure 2G:
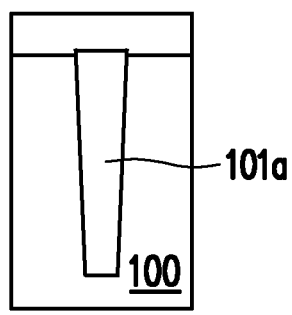
Figure 3G:
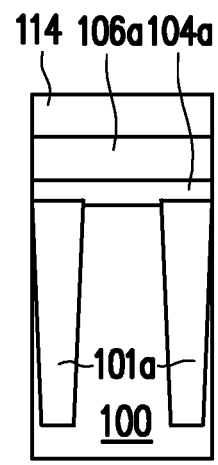
Figure 4G:
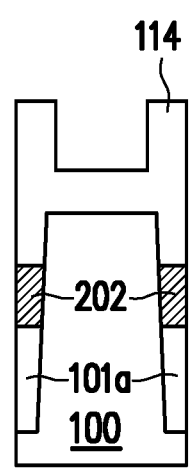
Figure 5G:
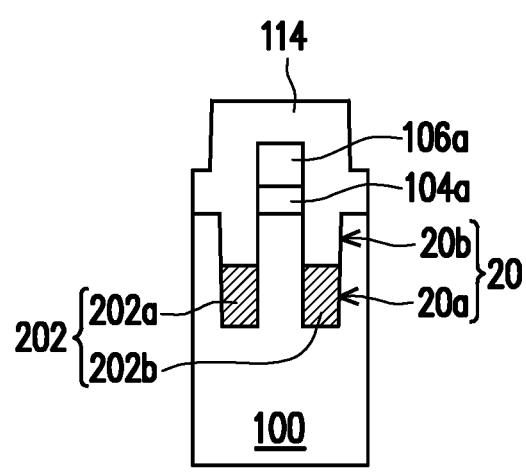
Figure 2H:
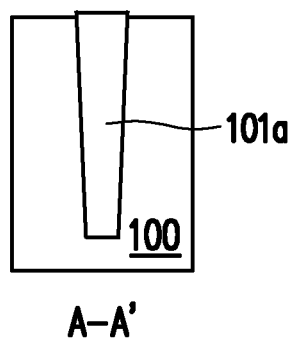
Figure 3H:
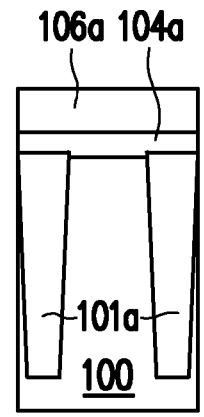
Figure 4H:
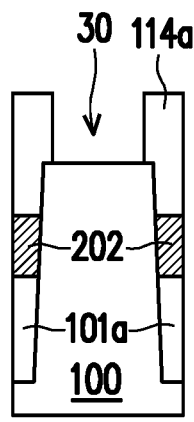

Referring to all of FIG. 1E to FIG. 5E and FIG. 1F to FIG. 5F, a conductive material is filled in the trenches 20 to form buried word lines 202a and 202b in the trenches 20. In an embodiment, the conductive material includes W, TiN, or a combination thereof. As shown in FIG. 4F and FIG. 5F, the conductive material is filled in the trenches 20 first, and then after a dry etching process, the top surface of the buried word lines 202a and 202b is lower than the top surface of the substrate 100. In an embodiment, two adjacent buried word lines 202a and 202b can be regarded as one word line set 202. The word line sets 202 parallel to the Y direction are disposed across and pass through the first isolation structures 101a and the strip patterns 103 to separate the substrate 100 into a plurality of first regions R1 and a plurality of second regions R2. As shown in FIG. 1F, the first regions R1 and the second regions R2 are alternately arranged along the X direction. The silicon nitride layer 106a between the word line sets 202 and the buried word lines 202a and 202b is located in the first regions R1.

Figure 5H:
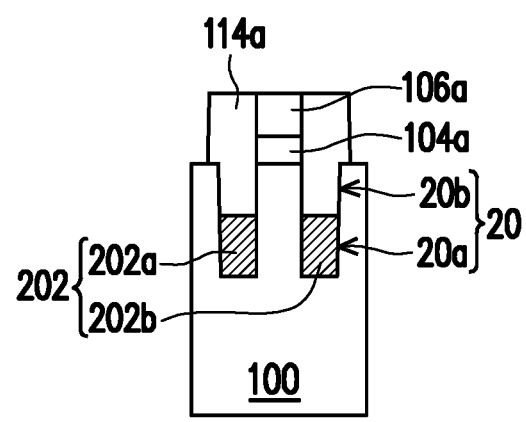
Figure 2I:
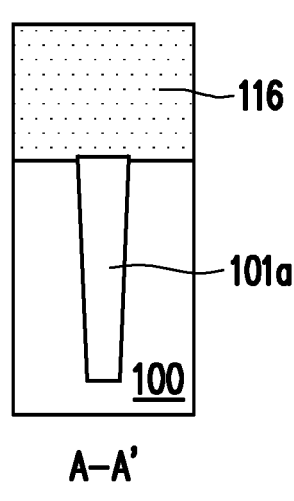
Figure 3I:
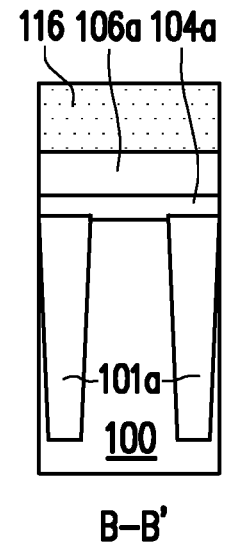
Figure 4I:
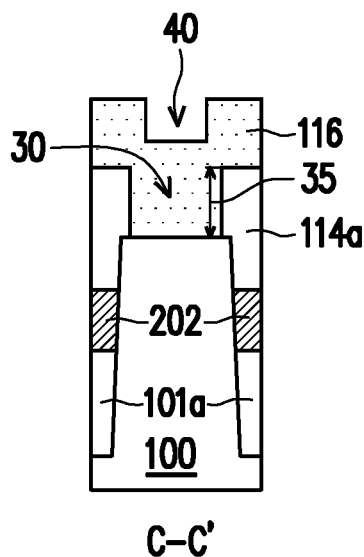
Figure 5I:
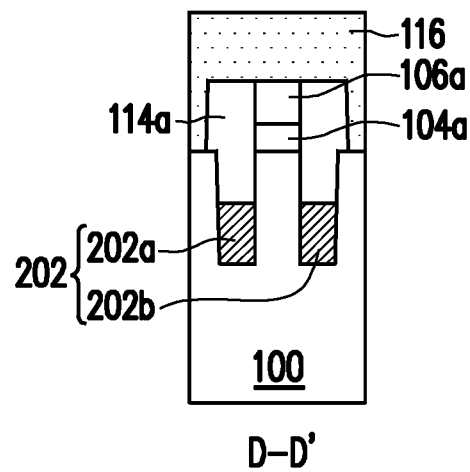
Figure 2J:
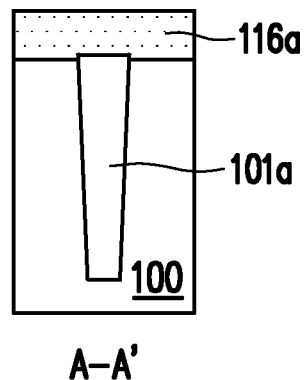
Figure 3J:
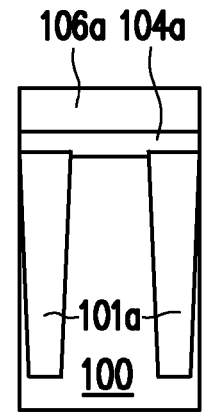
Figure 4J:
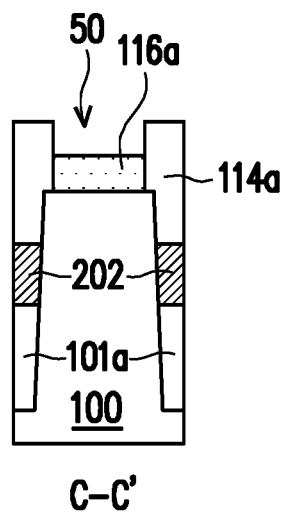

Referring to all of FIG. 1G to FIG. 5G and FIG. 1H to FIG. 5H, a dielectric layer 114 is formed on the substrate 100. In an embodiment, the dielectric layer 114 can be, for instance, silicon nitride grown along the sidewalls of the silicon oxide layer 104a and the silicon nitride layer 106a in the form of spacers and completely filling an upper portion 20b of the trenches 20 at the same time. Next, an etch-back process is performed to remove the dielectric layer 114 above the substrate 100 of the second regions R2 and form openings 30. A remaining dielectric layer (such as the first dielectric pattern) 114a still completely fills the upper portion 20b of the trenches 20 to cover the buried word lines 202a and 202b. In an embodiment, as shown in FIG. 5H, the top surface of the dielectric layer 114a and the top surface of the silicon nitride layer 106a are coplanar. In this case, as shown in FIG. 1H and FIG. 4H, the top surface of the substrate 100 of the second regions R2 is exposed to the dielectric layer 114a. Moreover, the dielectric layer 114a has a plurality of openings 30. The openings 30 can be strip openings parallel to the Y direction. The openings 30 are located in the second regions R2 and expose the top surface of the substrate 100 of the second regions R2. In an embodiment, as shown in FIG. 4H, the top surface of the dielectric layer 114a is higher than the top surface of the substrate 100 of the second regions R2. It should be mentioned that, for clarity, none of the top views after the step of FIG. 1H shows the dielectric layer 114a disposed on the word line sets 202.

Referring to all of FIG. 1H to FIG. 5H and FIG. 1I to FIG. 5I, a conductive layer 116 is formed on the substrate 100. In an embodiment, the material of the conductive layer 116 can be, for instance, doped polysilicon, metal silicide, silicon germanium, or a combination thereof. Since the openings 30 have a depth 35 (i.e., a height difference 35 between the top surface of the dielectric layer 114a and the top surface of the substrate 100), the conductive layer 116 also has a recess 40 along the shape of the openings 30. In an embodiment, when the deposition thickness of the conductive layer 116 is significantly greater than the depth 35 of the openings 30, the top surface of the conductive layer 116 can be a flat surface. In an embodiment, the depth 35 of the openings 30 can be, for instance, 30 nm to 80 nm.

Figure 5J:
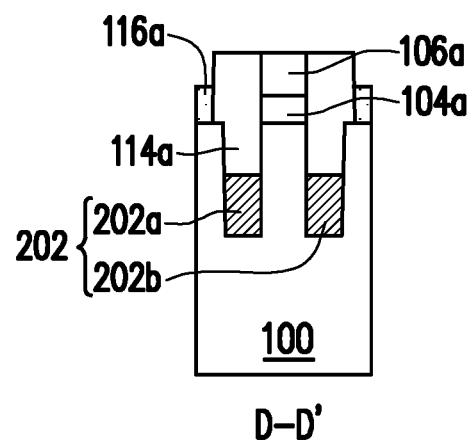
Figure 3K:
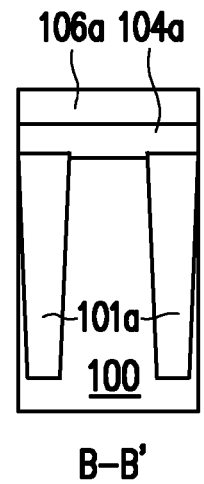
Figure 4K:
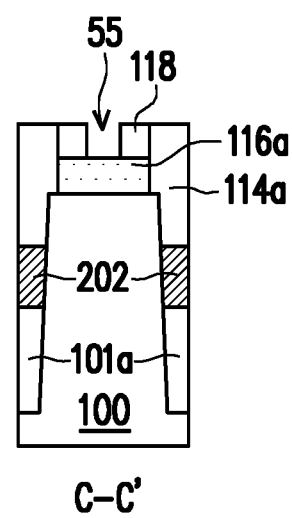
Figure 5K:
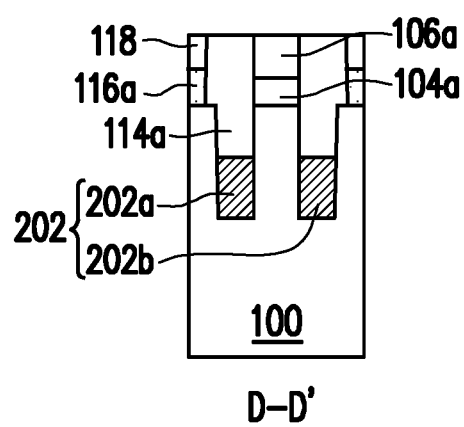
Figure 3L:
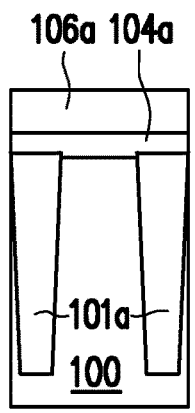
Figure 4L:
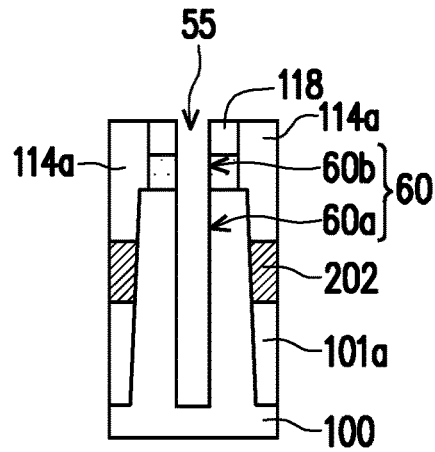
Figure 5L:
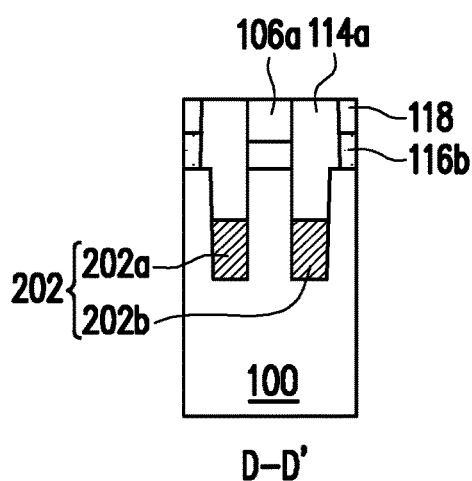
Figure 6A:
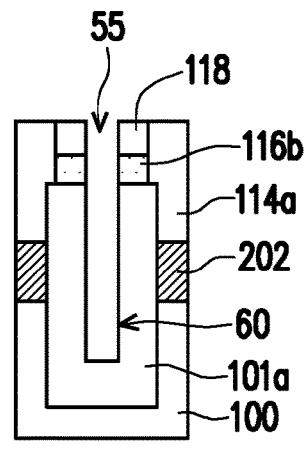
Figure 3M:
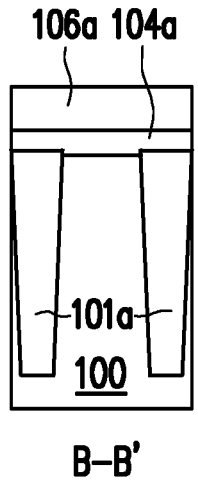
Figure 4M:
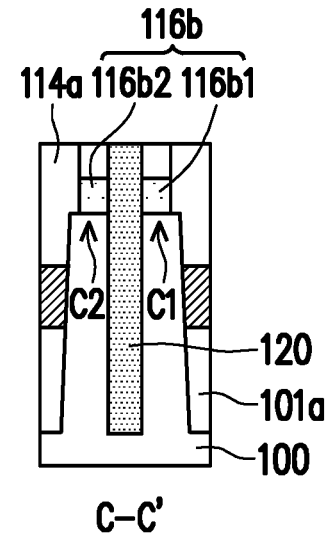
Figure 5M:
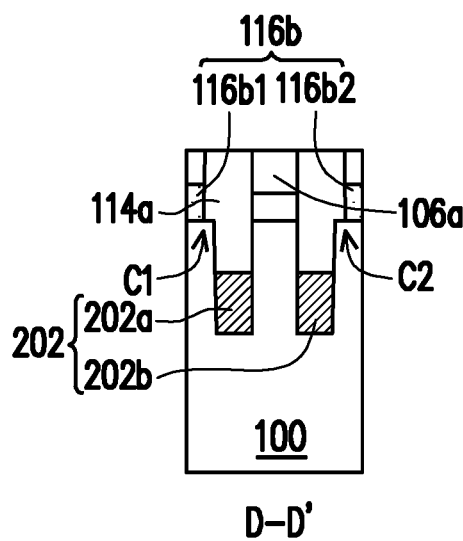
Figure 6B:
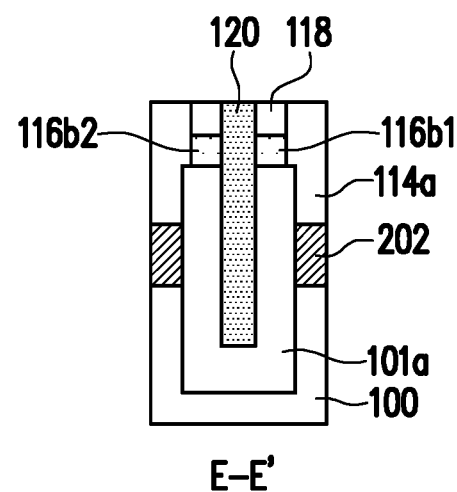
Figures 5N, 6C:
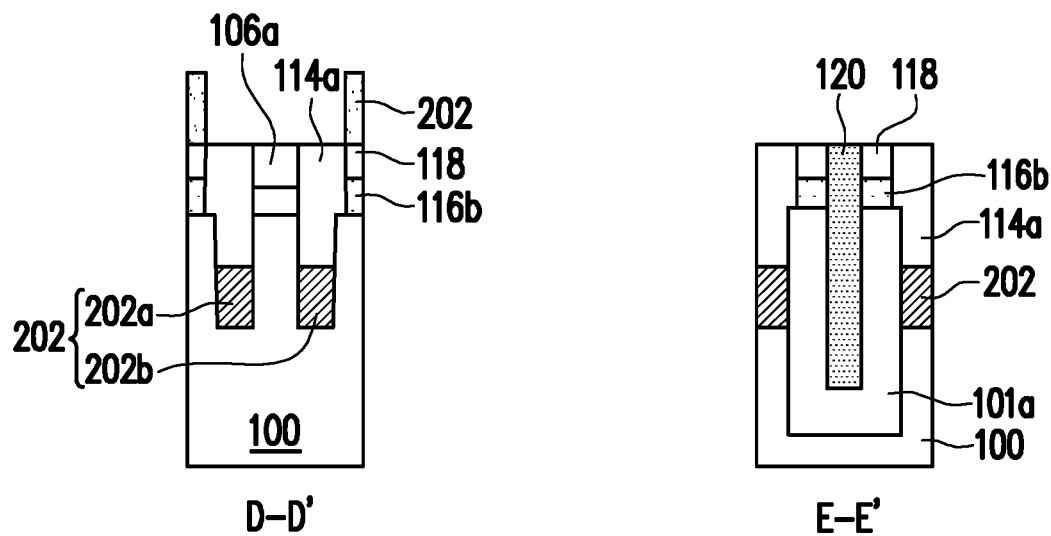
Figure 3P:
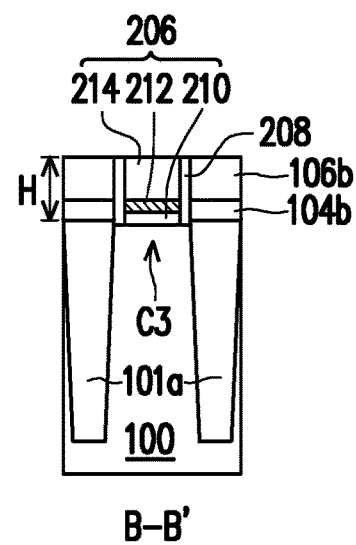
Figure 4P:
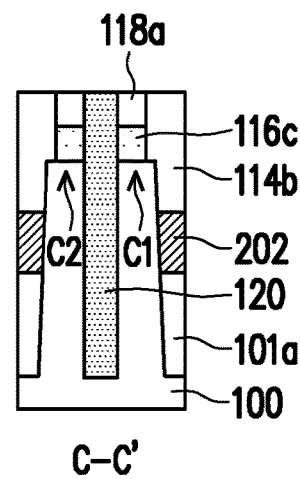
Figure 5P:
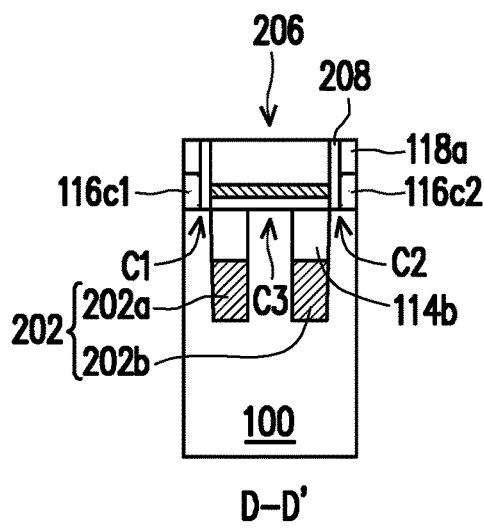
Figure 6E:
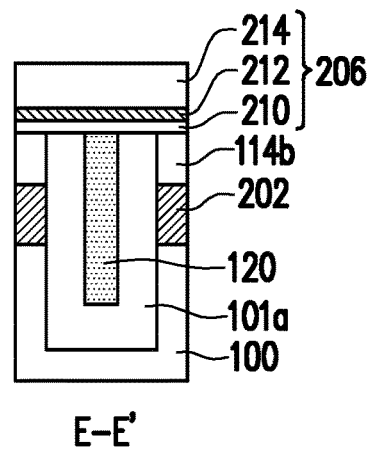

Referring to all of FIG. 1I to FIG. 5I and FIG. 1J to FIG. 5J, an etch-back process is performed on the conductive layer 116 to expose the top surface of the dielectric layer 114a and the top surface of the silicon nitride layer 106a. After the etch-back process, as shown in FIG. 4J and FIG. 5J, the top surface of the conductive layer 116a is lower than the top surface of the dielectric layer 114a. Moreover, as shown in FIG. 1J and FIG. 4J, the sidewall of the dielectric layer 114a and the top surface of the conductive layer 116a define a plurality of openings 50. In an embodiment, the openings 50 can be strip openings parallel to the Y direction and located on the substrate 100 of the second regions R2.

Referring to all of FIG. 1J to FIG. 5J and FIG. 1K to FIG. 5K, a dielectric material (not shown) is deposited on the sidewall of the openings 50 via a spacer method and etch-back is performed on the dielectric material to form dielectric layers (such as second dielectric patterns) 118, such that sub-openings 55 are formed between the dielectric layers 118. As shown in FIG. 4K, the sub-openings 55 (or the second dielectric patterns 118) expose the top surface of the conductive layer 116a. Specifically, the sub-openings 55 can be defined by the sidewall of the dielectric layers 118 and the top surface of the conductive layer 116a. In an embodiment, the material of the dielectric layers 118 can be, for instance, silicon nitride.

Referring to all of FIG. 1K to FIG. 5K, FIG. 1L to FIG. 5L, and FIG. 6A, a portion of the conductive layer 116a, a portion of the first isolation structures 101, and a portion of the substrate 100 are removed by using the dielectric layers 114a, 106a, and 118 as a mask to form trenches 60 in the conductive layer 116b, the first isolation structures 101, and the substrate 100. As shown in FIG. 1L, the trenches 60 can chop the strip patterns 103 to form a plurality of active areas AA. Specifically, as shown in FIG. 4L, the trenches 60 can be divided into lower trenches 60a and upper trenches 60b. The lower trenches 60a are located in the substrate 100; and the upper trenches 60b are located in the conductive layer 116b. The trenches 60 are strip trenches extended along the Y direction. It should be mentioned that, the step of forming the trenches 60 is a single step. In other words, the lower trenches 60a in the substrate 100 and the upper trenches 60b in the conductive layer 116b are formed in the same step. Therefore, the trenches 60 formed by the lower trenches 60a and the upper trenches 60b are continuous trenches and do not have an undercut structure. In other words, the sidewall of the trenches 60 has a continuous and flat surface.

Figure 1M:
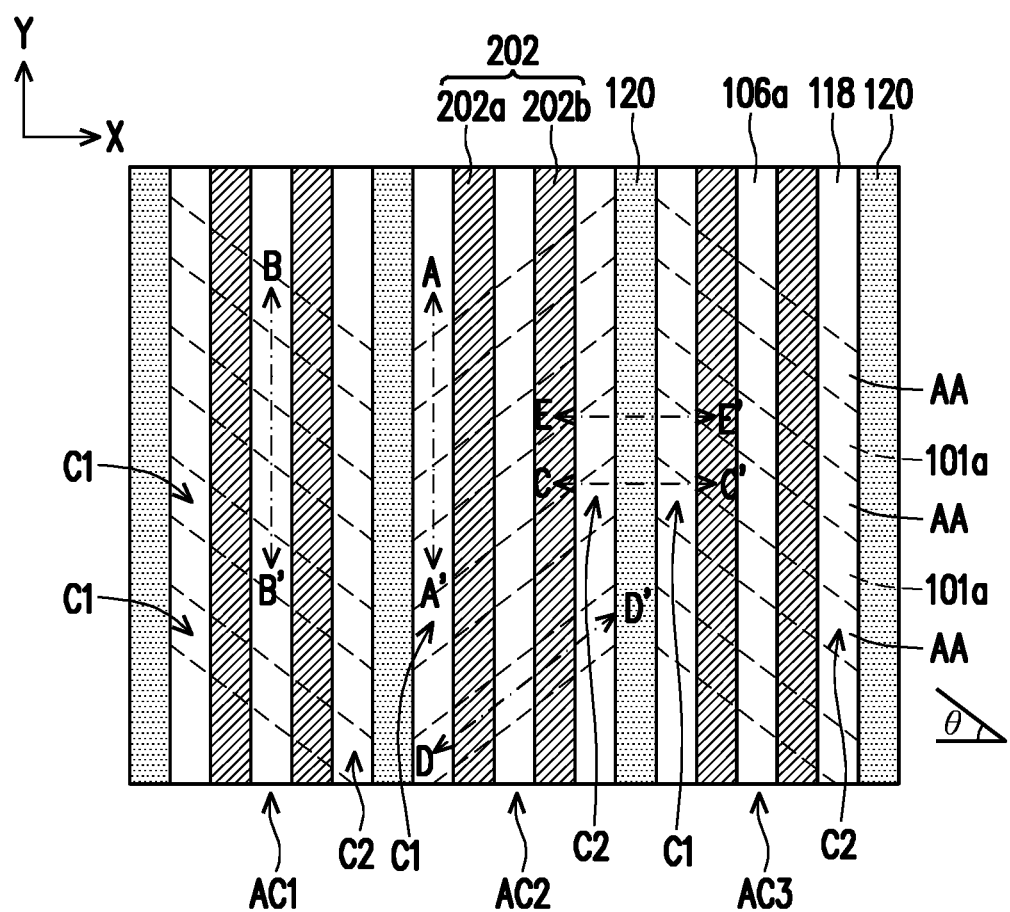

Referring to all of FIG. 1L to FIG. 5L, FIG. 1M to FIG. 5M, and FIG. 6B, a dielectric material is formed on the substrate 100 and a planarization process is performed to form second isolation structures 120 in the openings 55 and the trenches 60. In an embodiment, the planarization process can be an etch-back process, a chemical-mechanical polishing (CMP) process, or a combination thereof As shown in FIG. 1M, the second isolation structures 120 are extended along the Y direction and separate the strip patterns 103 into a plurality of active areas AA. The active areas AA are disposed as ribbons and arranged in a first array. In the present embodiment, the active areas AA are arranged into 3 active area columns AC1 to AC3. For instance, the length direction of the active area columns AC1 and AC3 is non-orthogonal to the X direction and the two form an angle θ. In an embodiment, the angle θ can be between 0 degrees and 45 degrees and two adjacent active areas can be disposed as mirror images. However, the invention is not limited thereto, and in other embodiments, two adjacent active areas can also be disposed the same (i.e., disposed as non-mirror images). In an embodiment, as shown in FIG. 4M, the bottom surface of the second isolation structures 120 and the bottom surface of the first isolation structures 101a are coplanar.

Moreover, the second isolation structures 120 also separate the conductive layer 116b into two strips of conductive patterns 116b1 and 116b2. The conductive patterns 116b1 and 116b2 are respectively in contact with or connected to the active areas AA arranged in the same row to form a first contact region C1 and a second contact region C2.

It should be mentioned that, the material of the second isolation structures 120 can be silicon nitride. In comparison to known silicon oxide, silicon nitride does not readily react with the silicon substrate 100. Therefore, the second isolation structures 120 formed by silicon nitride of the present embodiment can reduce loss of the silicon substrate 100 to prevent the issue of reduced contact area between the active areas and the capacitor contacts.

Figure 1N:
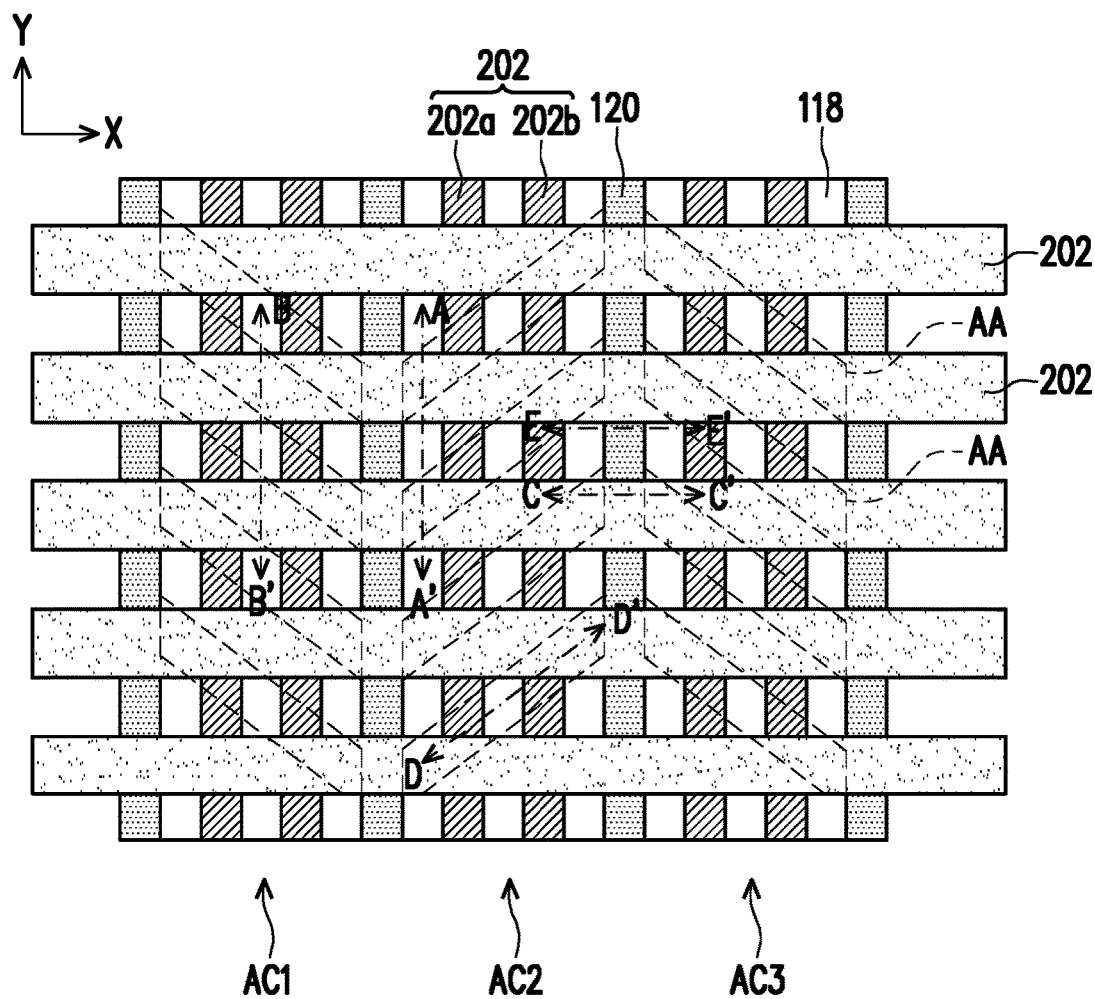
Figure 10:
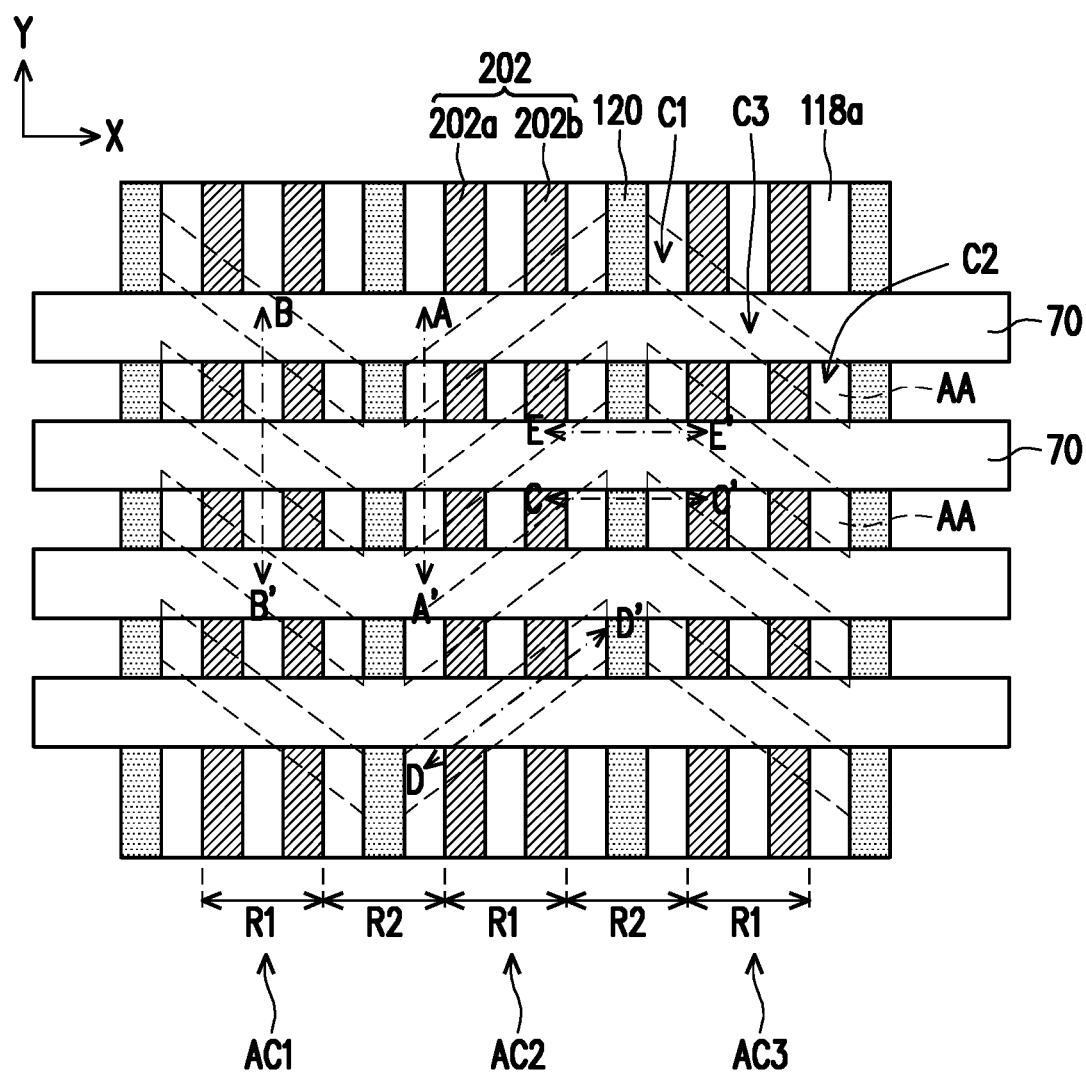

Referring to all of FIG. 1M to FIG. 5M, FIG. 1N to FIG. 5N, and FIG. 6C, a mask pattern 204 is formed on the substrate 100. As shown in FIG. 1N, the mask pattern 204 can be a strip pattern extended along the X direction and alternately arranged along the Y direction to define the location of subsequently-formed bit line structures 206 (as shown in FIG. 1P). In an embodiment, the material of the mask layer 204 can be a photoresist.

Referring to all of FIG. 1N to FIG. 5N, FIG. 1O to FIG. 5O, and FIG. 6D, a portion of the dielectric layers 118, the conductive layer 116b, the silicon nitride layer 106a, the silicon oxide layer 104a, and the dielectric layer 114a is removed by using the mask pattern 204 as a mask to form a plurality of openings 70. In the present embodiment, as shown in FIG. 1O, the openings 70 can be strip openings extended along the X direction and alternately arranged along the Y direction. The openings 70 are disposed across the first regions R1 and the second regions R2 to define the location of the subsequently-formed bit line structures 206 (as shown in FIG. 1P). The openings 70 expose a portion of the top surface of the active areas AA. The top surface of the exposed active areas AA can be regarded as a third contact region C3 to be in contact with the subsequently-formed bit line structures 206 (as shown in FIG. 1P). As shown in FIG. 1O and FIG. 5O, the two adjacent buried word lines 202a and 202b sandwich the third contact region C3 disposed in the same column.

Moreover, in this stage, the openings 70 also separate the conductive patterns 116C into two conductive columns 116c1 and 116c2. The conductive columns 116c1 and 116c2 are arranged in a second array. Two adjacent rows of the conductive columns 116c1 and 116c2 are in contact with the active areas AA arranged in the same column to be connected to the first contact region C1 and the second contact region C2. Specifically, as shown in FIG. 1O and FIG. 4O, the conductive column 116c1 is disposed on the first contact region C1 and in contact with the first contact region C1. The conductive column 116c2 is disposed on the second contact region C2 and in contact with the second contact region C2. The first contact region C1 and the second contact region C2 are respectively disposed at two endpoints of the long side of the active areas AA. In an embodiment, the conductive columns 116c1 and 116c2 can be regarded as capacitor contacts that can be electrically connected to the first contact region C1 and the second contact region C2 (i.e., the active areas AA) and the subsequently-formed capacitors (not shown). It should be mentioned that, the top surface width (or top surface area) and the bottom surface width (or bottom surface area) of each of the conductive columns 116c1 and 116c2 are substantially the same. Therefore, in the present embodiment, the contact area between the capacitor contacts (i.e., the conductive columns 116c1 and 116c2) and the active areas AA can be maintained or increased to maintain or reduce the resistance between the active areas and the capacitor contacts, so as to increase the write recovery time of the memory device.

Figure 1P:
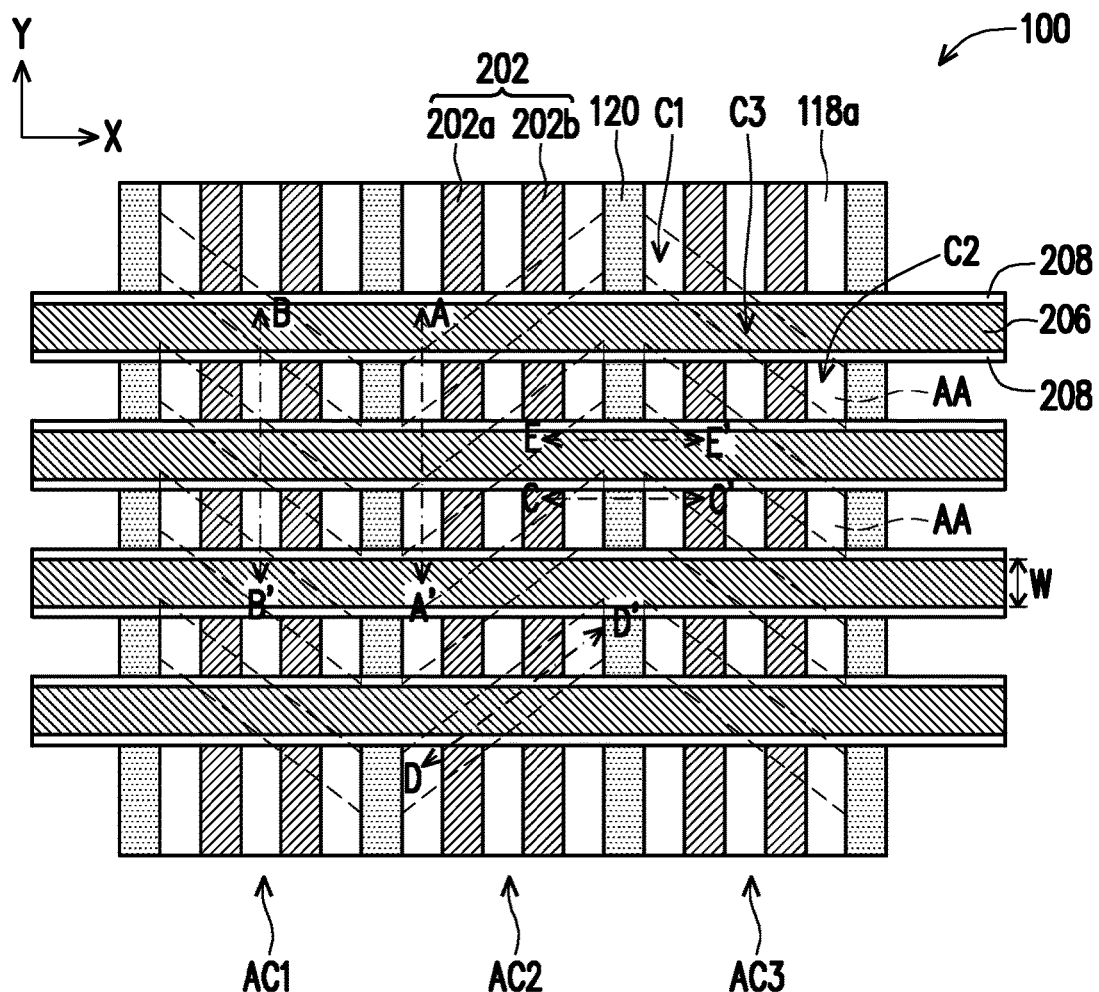

Referring to all of FIG. 1O to FIG. 5O, FIG. 1P to FIG. 5P, and FIG. 6E, spacers 208 are formed on the sidewall in the openings 70. Next, bit line structures 206 are formed between the spacers 208 such that the spacers 208 are disposed on the sidewall of the bit line structures 206 to electrically isolate the bit line structures 206 and the conductive columns 116c1 and 116c2. As shown in FIG. 1P, each of the bit line structures 206 is in contact with the active regions AA arranged in the same column to form a third contact region C3 between the first contact region C1 and the second contact region C2. Specifically, each of the bit line structures 206 includes a bit line contact 210, a bit line 212, and a cap layer 214 in order from bottom to top. The bit line contact 210 is located between the bit line 212 and the third contact region C3 to be electrically connected to the bit line 212 and the third contact region C3 (or the active areas AA). In an embodiment, the material of the bit line contact 210 can be polysilicon, and the forming method thereof can include, for instance, a chemical vapor deposition followed by etch-back. The material of the bit line 212 can be a conductive material such as W, TiN, or a combination thereof. The forming method of the bit line can include, for instance, a chemical vapor deposition or a physical vapor deposition. The material of the cap layer 214 can be silicon nitride, and the forming method thereof can include, for instance, a chemical vapor deposition followed by a planarization process. The material of the spacers 208 can be silicon nitride, and a metal silicide layer (not shown) such as TiSi, CoSi, or NiSi, or a combination thereof can also be included between the bit line contact 210 and the bit line 212.

After the bit line structures 206 are formed, a planarization process can be performed to expose the top surfaces of the conductive columns 116c1 and 116c2. Next, a plurality of capacitors (not shown) can be respectively formed on the conductive columns 116c1 and 116c2. In an embodiment, the conductive columns 116c1 and 116c2 can be regarded as capacitor contacts to be electrically connected to the active areas AA and the capacitors (not shown).

It should be mentioned that, in the present embodiment, a damascene process is adopted to form the bit line structures 206 and the spacers 208 at two sides of the bit line structures 206. Therefore, the manufacturing method of the memory device of the present embodiment can solve the known issue of taper profile caused by bit line structures having a high aspect ratio. Moreover, since in the present embodiment, a damascene process is used to form the bit line structures 206, the height of the bit line structures 206 of the present embodiment can be reduced such that the aspect ratio of the bit line structures 206 is reduced. In an embodiment, a height H of the bit line structures 206 can be between 40 nm and 100 nm. The aspect ratio (H/W) of the bit line structures 206 can be between 2 and 5.

Moreover, the manufacturing method of the memory device of the present embodiment forms the capacitor contacts (i.e., the conductive columns 116c1 and 116c2), the second isolation structures 120, and the bit line contacts 210 in a self-align manner. In comparison to known techniques, in the present embodiment, the number of masks can be reduced to lower production cost. Moreover, reducing the alignment steps in the process can also alleviate the issue of reduced contact area between the active areas and the capacitor contacts and the contact area between the active areas and the bit line contacts caused by an offset in the lithography process. Therefore, in the present embodiment, the resistance between the active areas and the capacitor contacts and the resistance between the active areas and the bit line contacts can be maintained or reduced to increase the write recovery time of the memory device so as to increase product yield and reliability.

Figure 1Q:
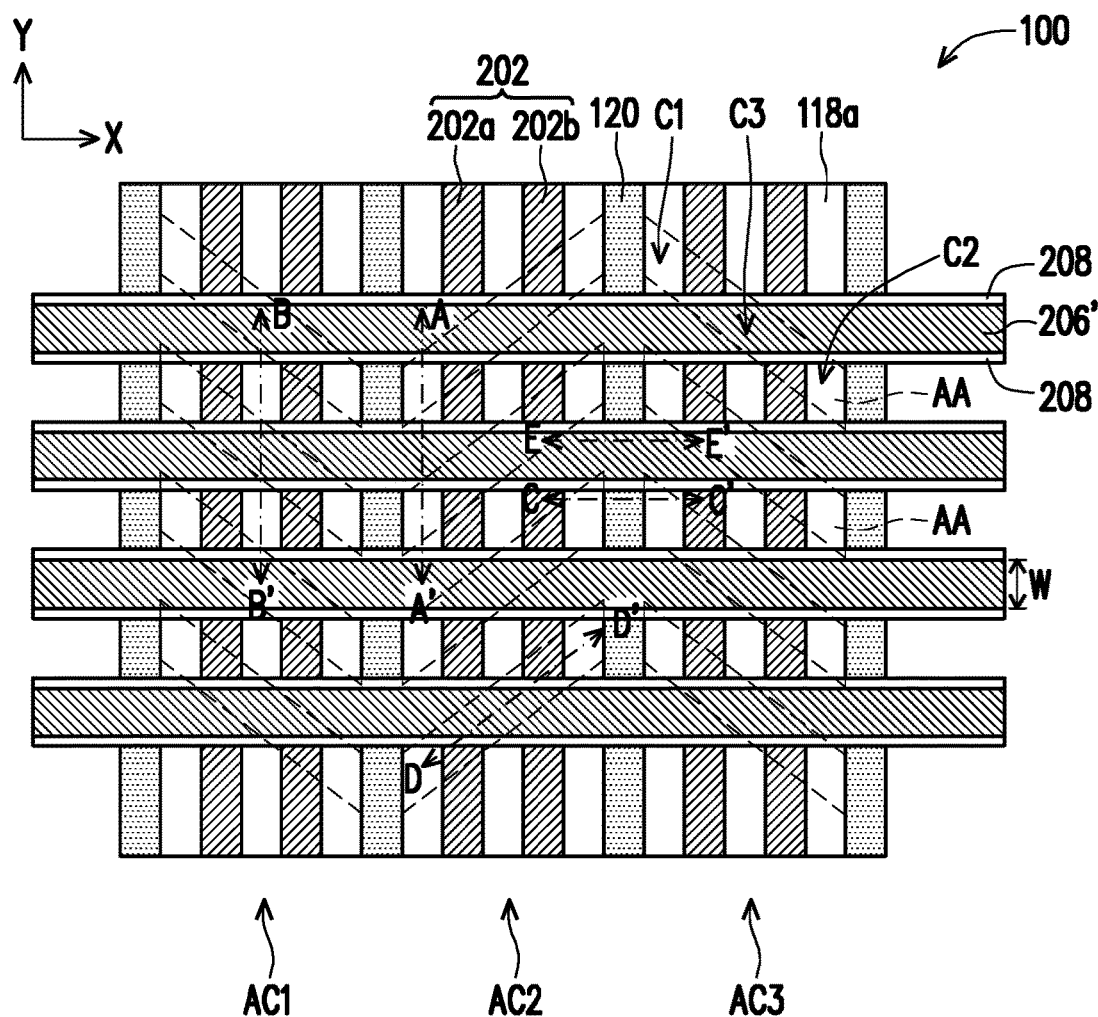
Figure 2A:
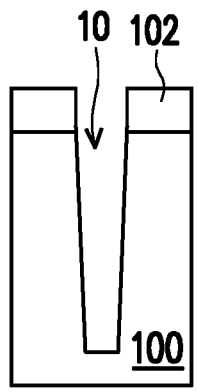
FIG. 2A to FIG. 2P are cross sections along segment A-A' of FIG. 1A to FIG. 1P.
Figure 3A:
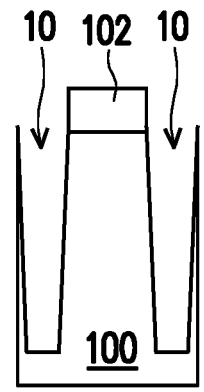
FIG. 3A to FIG. 3P are cross sections along segment B-B' of FIG. 1A to FIG. 1P.
Figure 2K:
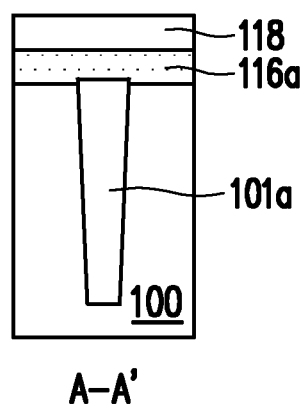
Figure 2L:
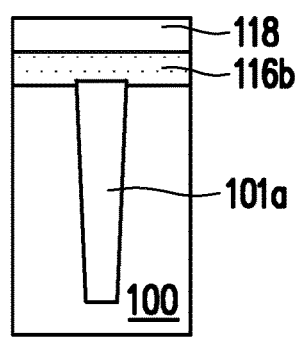
Figure 2M:
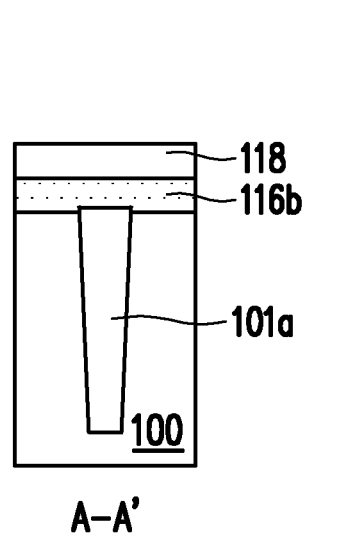
Figures 2N, 3N, 4N:
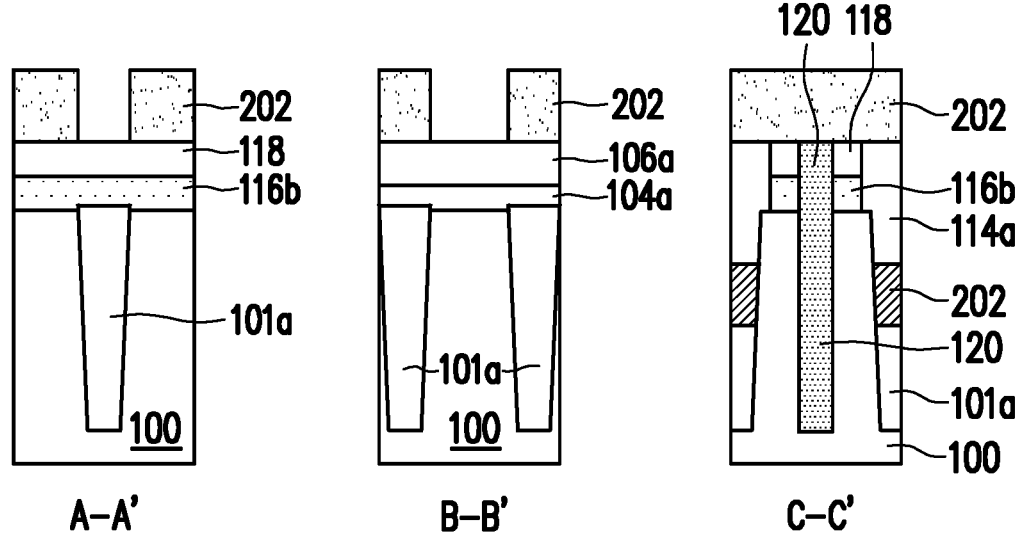
Figure 2P:
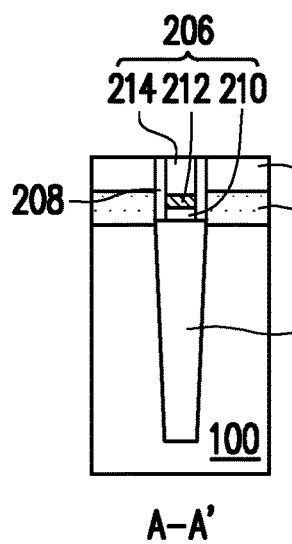
Figure 2Q:
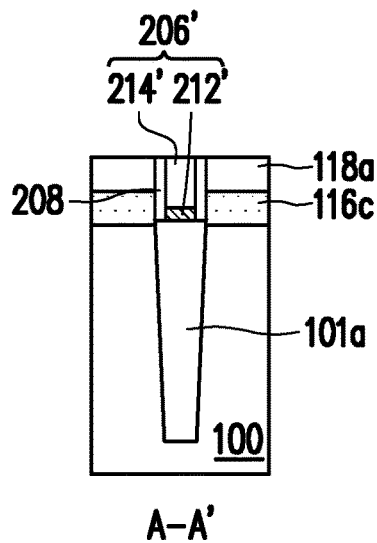
Figure 3Q:
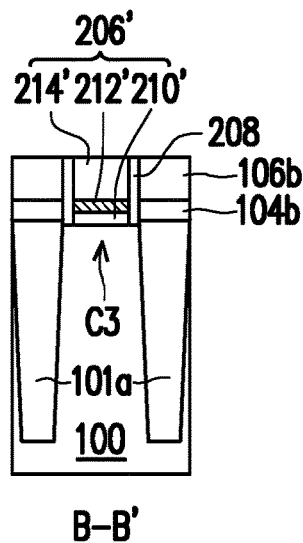
Figure 4Q:
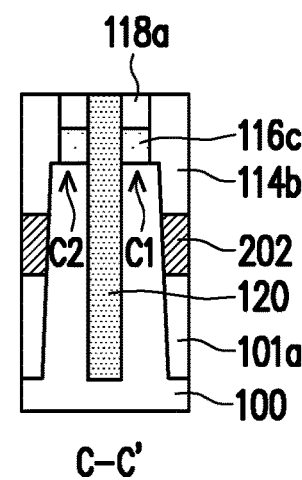
Figure 5Q:
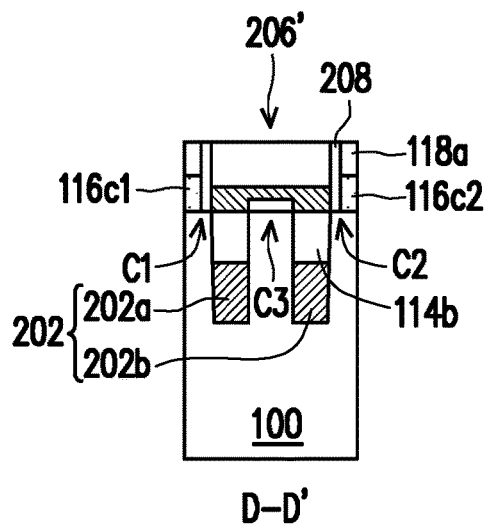
Figure 6F:
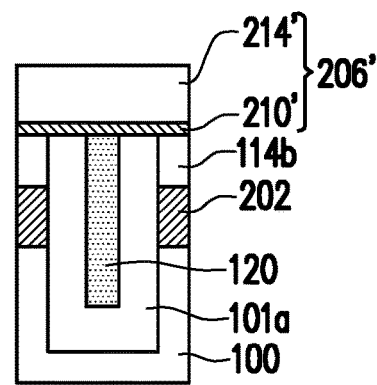
FIG. 6F is a cross section along segment E-E' of FIG. 1Q.

FIG. 1Q is a top view of a memory device of the second embodiment of the invention. FIG. 2Q is a cross section along segment A-A' of FIG. 1Q. FIG. 3Q is a cross section along segment B-B' of FIG. 1Q. FIG. 4Q is a cross section along segment C-C' of FIG. 1Q. FIG. 5Q is a cross section along segment D-D' of FIG. 1Q. FIG. 6F is a cross section along segment E-E' of FIG. 1Q. It should be mentioned that, FIG. 1Q to FIG. 5Q and FIG. 6F are manufacturing steps after the stages of FIG. 1O to FIG. 5O and FIG. 6D. Since the steps of FIG. 1O to FIG. 5O and FIG. 6D are described in detail in above, they are not repeated herein.

Referring to FIG. 1Q to FIG. 5Q and FIG. 6F, after openings 60 are formed, spacers 208 are formed on the sidewall in the openings 60. Next, bit line structures 206' are formed between the spacers 208. Specifically, each of the bit line structures 206' includes a bit line contact 210', a bit line 212', and a cap layer 214' in order from bottom to top. Basically, the bit line structures 206' of the second embodiment are similar to the bit line structures 206 of the first embodiment. The difference between the two is: the bit line contact 210' of the second embodiment is an epitaxial silicon layer formed by selective epitaxial growth (SEG). In other words, the bit line contact 210' is only formed on the silicon substrate 100 (as shown in FIG. 3Q) and is not formed on the first isolation structures 101a (as shown in FIG. 2Q). Therefore, the bit line contact 210' is disposed on the third contact region C3 of the active areas AA in the form of a block and not in the strip form of the bit line contact 210. Next, the bit line 212' and the cap layer 214' are formed on the bit line contact 210' in order. Since the material and the forming method of the bit line 212' and the cap layer 214' are similar to those of the bit line 212 and the cap layer 214, they are not repeated herein.

Based on the above, in the invention, isolation structures can be formed by forming self-aligned trenches to alleviate the issue of reduced contact area between the active areas and the capacitor contacts caused by an offset in the lithography process. Moreover, in the invention, silicon nitride is used as the material of the self-aligned isolation structures to reduce the loss of the silicon substrate and prevent the issue of reduced contact area between the active areas and the capacitor contacts. Moreover, the invention can reduce the alignment steps in the process to reduce the number of photomasks and therefore lower production cost.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A manufacturing method of a memory device, comprising:
    forming a plurality of first isolation structures in a substrate, wherein the first isolation structures separate the substrate into a plurality of strip patterns, and the strip patterns are bent or straight;

forming a plurality of word line sets in the substrate, wherein the word line sets are extended along a Y direction and pass through the first isolation structures and the strip patterns to divide the substrate into a plurality of first regions and a plurality of second regions, and the first regions and the second regions are alternately arranged along an X direction and the word line sets are located in the first regions;

forming a first dielectric pattern on the substrate, wherein the first dielectric pattern covers the word line sets and exposes a surface of the substrate of the second regions;

forming a conductive layer on the substrate of the second regions, wherein a top surface of the conductive layer is lower than a top surface of the first dielectric pattern;

forming a plurality of second isolation structures in the conductive layer and the substrate of the second regions, wherein the second isolation structures are extended along the Y direction and separate the strip patterns into a plurality of active areas, and the active areas are disposed as ribbons and arranged in a first array; and forming a plurality of bit line structures on the substrate, wherein the bit line structures are extended along the X direction and disposed across the word line sets.

2. The manufacturing method of the memory device of claim 1, wherein a forming step of the second isolation structures comprises:

forming a second dielectric pattern on the substrate, wherein the second dielectric pattern exposes a portion of a surface of the conductive layer;

removing a portion of the conductive layer, a portion of the first isolation structures, and a portion of the substrate by using the first dielectric pattern and the second dielectric pattern as a mask to form a plurality of trenches; and filling the trenches with a dielectric material.

3. The manufacturing method of the memory device of claim 2, wherein the dielectric material is silicon nitride.

4. The manufacturing method of the memory device of claim 2, wherein the trenches are strip trenches extended along the Y direction and a step of the trenches is a single step such that upper trenches in the conductive layer and lower trenches in the substrate are continuous trenches.

5. The manufacturing method of the memory device of claim 2, wherein a forming step of the bit line structures comprises:

forming a mask pattern on the second dielectric pattern after the second isolation structures are formed;

performing an etching process by using the mask pattern as a mask to form a plurality of strip openings, wherein the strip openings are disposed across the first regions and the second regions to define a location of the bit line structures;

forming spacers on a sidewall of the strip openings; and forming a bit line contact, a bit line, and a cap layer between the spacers in order.

6. The manufacturing method of the memory device of claim 5, wherein the strip openings separate the conductive layer into a plurality of conductive columns, the conductive columns are arranged in a second array, and two adjacent rows of the conductive columns are in contact with the active areas arranged in the same column to form a first contact region and a second contact region, and the first contact region and the second contact region are located at two endpoints of a long side of the corresponding active area.

7. The manufacturing method of the memory device of claim 5, wherein each of the strip openings exposes a portion of a surface of the corresponding active area to form a third contact region, and the bit line contact is located between the bit line and the third contact region to be electrically connected to the bit line and the third contact region.

8. The manufacturing method of the memory device of claim 5, wherein a material of the bit line contact comprises polysilicon, and a forming method thereof comprises a chemical vapor deposition method; or the material of the bit line contact comprises epitaxial silicon, and the forming method thereof comprises a selective epitaxial growth method.

9. A memory device, comprising:

a substrate comprising a plurality of active areas, wherein the active areas are disposed as ribbons and arranged in a first array;

a plurality of isolation structures located in the substrate and extended along a Y direction, wherein each of the isolation structures is disposed between two adjacent columns of the active areas;

a plurality of conductive columns located on the substrate and arranged in a second array, wherein two adjacent rows of the conductive columns are in contact with the active areas arranged in the same column to form a first contact region and a second contact region;

a plurality of bit line structures disposed on the substrate in a parallel manner along an X direction, wherein each of the bit line structures is in contact with the active areas arranged in the same column to form a third contact region between the first contact region and the second contact region; and a plurality of spacers disposed on a sidewall of the bit line structures in a parallel manner along the X direction to electrically isolate the bit line structures and the conductive columns.

10. The memory device of claim 9, wherein a material of the isolation structures comprises silicon nitride, and the isolation structures are strip continuous structures.

11. The memory device of claim 9, wherein a top surface width and a bottom surface width of each of the conductive columns are substantially the same.

12. The memory device of claim 9, further comprising a plurality of word line sets located in the substrate and extended along the Y direction, wherein each of the word line sets has two buried word lines and the two buried word lines sandwich the third contact region of the active areas arranged in the same column.

13. The memory device of claim 9, wherein each of the bit line structures comprises a bit line contact, a bit line, and a cap layer, and the bit line contact is located between the bit line and the third contact region to be electrically connected to the bit line and the third contact region.

14. The memory device of claim 13, wherein the bit line contact comprises a polysilicon layer, an epitaxial silicon layer, or a combination thereof.

15. The memory device of claim 9, further comprising a plurality of capacitors respectively located on the conductive columns.

16. The memory device of claim 15, wherein the conductive columns in contact with the first contact region and the second contact region are capacitor contacts.

* * * * *